(12) United States Patent
Takeuchi et al.

(10) Patent No.: US 7,886,688 B2
(45) Date of Patent: *Feb. 15, 2011

(54) PLASMA PROCESSING APPARATUS

(75) Inventors: Toshimasa Takeuchi, Hachioji (JP); Setsuo Nakajima, Hachioji (JP); Naomichi Saito, Hachioji (JP); Osamu Nishikawa, Hachioji (JP)

(73) Assignee: Sekisui Chemical Co., Ltd., Osaka (JP)

( * ) Notice: Subject to any disclaimer, the term of this patent is extended or adjusted under 35 U.S.C. 154(b) by 977 days.

This patent is subject to a terminal disclaimer.

(21) Appl. No.: 11/663,983

(22) PCT Filed: Sep. 20, 2005

(86) PCT No.: PCT/JP2005/017252

§ 371 (c)(1),
(2), (4) Date: Mar. 29, 2007

(87) PCT Pub. No.: WO2006/035629

PCT Pub. Date: Apr. 6, 2006

(65) Prior Publication Data

US 2008/0193342 A1    Aug. 14, 2008

(30) Foreign Application Priority Data

| Sep. 29, 2004 | (JP) | 2004-285506 |
| Sep. 29, 2004 | (JP) | 2004-285507 |
| Sep. 29, 2004 | (JP) | 2004-285508 |
| Jul. 22, 2005 | (JP) | 2005-212397 |
| Aug. 23, 2005 | (JP) | 2005-240542 |
| Aug. 23, 2005 | (JP) | 2005-240543 |
| Aug. 30, 2005 | (JP) | 2005-249345 |
| Sep. 12, 2005 | (JP) | 2005-263237 |

(51) Int. Cl.
C23C 16/00    (2006.01)
C23F 1/00    (2006.01)
H01L 21/306    (2006.01)

(52) U.S. Cl. .............. 118/723 E; 118/715; 118/716; 118/722; 118/723 R; 156/345.43; 156/345.45; 156/345.51

(58) Field of Classification Search ............ 118/723 R; 313/231.01, 231.31; 315/111.21
See application file for complete search history.

(56) References Cited

U.S. PATENT DOCUMENTS 5,273,588 A * 12/1993 Foster et al. ............. 118/723 E (Continued)

FOREIGN PATENT DOCUMENTS

JP    03-265410 A    11/1991

(Continued)

OTHER PUBLICATIONS

WIPO Publication WO2004/021748. Performed and printed on May 14, 2010 from http://www.wipo.int/pctdb/images1/PCT-PAGES/2004/112004/04021748/04021748.pdf.*

(Continued)

*Primary Examiner*—Parviz Hassanzadeh
*Assistant Examiner*—Tiffany Nuckols
(74) *Attorney, Agent, or Firm*—Sughrue Mion, PLLC

(57) ABSTRACT

To provide a plasma processing apparatus capable of enhancing insulation between an electrode and a casing and adjusting the temperature of the electrode from outside.

An electrode 30 is provided at its discharge space forming surface with a solid dielectric 50. The electrode 30 is received in a casing 20 such that the solid dielectric 50 on the discharge space forming surface is exposed. An in-casing space 29 between the casing 20 and the electrode 30 disposed in the casing 20 is filled with substantially pure nitrogen gas. This nitrogen gas pressure is more increased than the pressure in the discharge space. Preferably, nitrogen gas is allowed to flow.

13 Claims, 10 Drawing Sheets

U.S. PATENT DOCUMENTS

| | | | |
|---|---|---|---|
| 5,376,213 A | 12/1994 | Ueda et al. | |
| 5,866,872 A * | 2/1999 | Lu et al. | 219/121.56 |
| 6,086,710 A | 7/2000 | Miyashita | |
| 6,397,775 B1 | 6/2002 | Sano et al. | |
| 6,444,085 B1 * | 9/2002 | Collins et al. | 156/345.1 |
| 6,617,538 B1 * | 9/2003 | Mahawili | 219/121.36 |
| 6,645,302 B2 * | 11/2003 | Udagawa | 118/715 |
| 6,872,281 B1 | 3/2005 | Chen et al. | |
| 2001/0030541 A1 | 10/2001 | Fujita | |
| 2002/0134512 A1 | 9/2002 | Adachi | |
| 2004/0134616 A1 | 7/2004 | Sago et al. | |
| 2004/0175498 A1 * | 9/2004 | Hedhli et al. | 427/248.1 |
| 2005/0001527 A1 | 1/2005 | Sugiyama | |
| 2005/0016457 A1 | 1/2005 | Kawasaki et al. | |
| 2006/0096539 A1 | 5/2006 | Kawasaki et al. | |
| 2008/0131336 A1 * | 6/2008 | Mayumi et al. | 422/186 |

FOREIGN PATENT DOCUMENTS

| | | |
|---|---|---|
| JP | 9-92493 A | 4/1997 |
| JP | 11-106531 A | 4/1999 |
| JP | 11-262121 A | 9/1999 |
| JP | 2000-82595 A | 3/2000 |
| JP | 2000-192244 A | 7/2000 |
| JP | 2001-259409 A | 9/2001 |
| JP | 2001-260221 A | 9/2001 |
| JP | 2001-297854 A | 10/2001 |
| JP | 2002-018276 A | 1/2002 |
| JP | 2002-52651 A | 2/2002 |
| JP | 2002-124511 A | 4/2002 |
| JP | 2003-060015 A | 2/2003 |
| JP | 2003-268549 A | 9/2003 |
| JP | 2004-128410 A | 4/2004 |
| JP | 2004-128417 A | 4/2004 |
| JP | 2004-181306 A | 7/2004 |
| JP | 2004-228136 A | 8/2004 |
| JP | 2004-259484 A | 9/2004 |
| WO | 96/31997 A1 | 10/1996 |

OTHER PUBLICATIONS

Japanese Office Action dated Jul. 28, 2009 in corresponding Japanese Patent Application No. 2005-263237.

Japanese Office Action dated Aug. 11, 2009 in corresponding Japanese Patent Application No. 2005-249345.

Japanese Office Action dated Sep. 1, 2009 in corresponding Japanese Patent Application No. 2005-212397.

L. Bardos, et al, "Radio Frequency Plasma Jet Applied to Coating of Internal Walls of Narrow Tubes," J. vac. Sci. Technol. A, American Vacuum Society, 1993, pp. 1486-1490, vol. 11, No. 4.

* cited by examiner

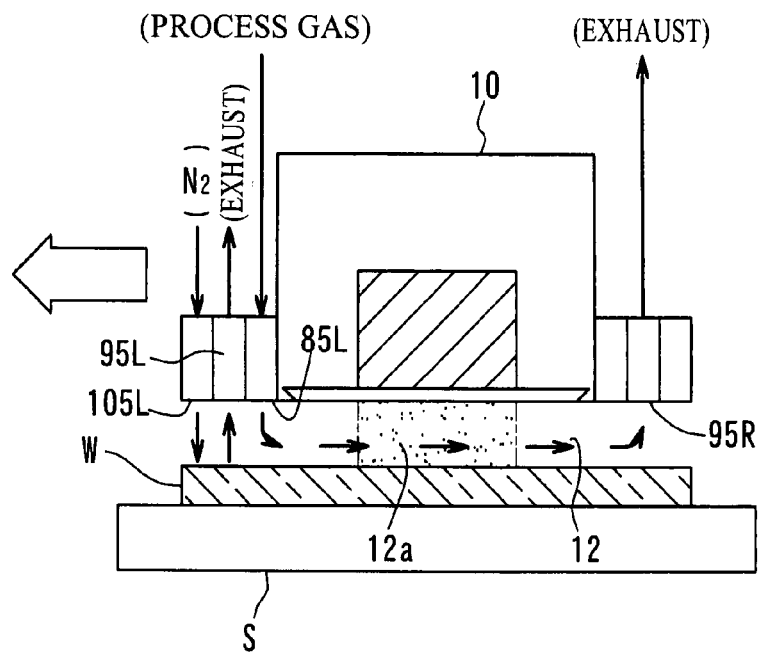
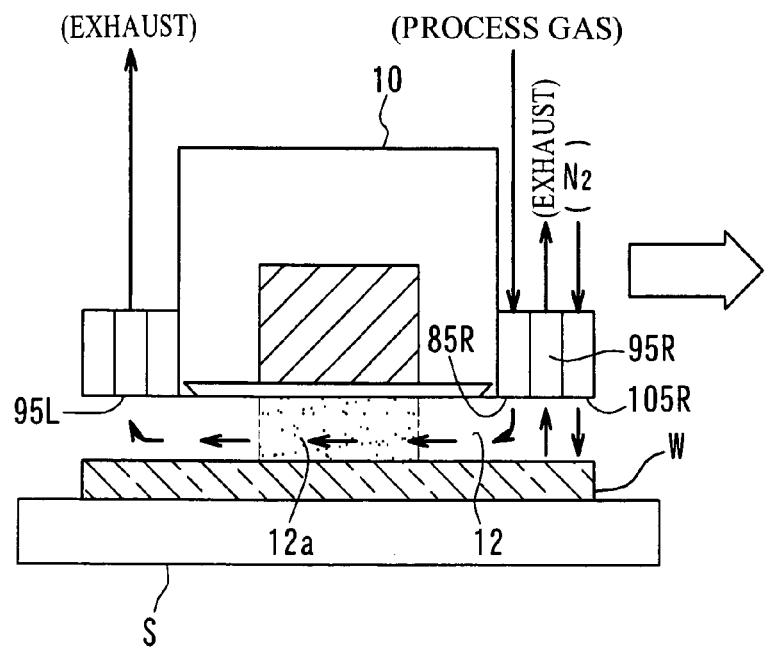

PLASMA PROCESSING APPARATUS

TECHNICAL FIELD

This invention relates to a plasma processing apparatus in which a process gas is introduced into a discharge space and plasma processing is carried out on a substrate.

BACKGROUND ART

For example, in a plasma processing apparatus described in Patent Document 1, an electrode connected to a power source and an electrode grounded to the earth are arranged in a vertically opposing relation. Each electrode is received in a metal-made frame through a holder composed of an insulating material such as resin. An atmospheric pressure plasma discharge space is formed between those electrodes and a substrate is arranged in this discharge space so as to be subjected to plasma processing. As a cooling medium for the electrode, water is used in general. The electrodes are firmly fixed to the holder of the apparatus main body without play. Patent Document 2 discloses that electrodes are gently held by a holder.

[Patent Document 1] Japanese Patent Application Laid-Open No. 2004-228136
[Patent Document 2] Japanese Patent Application Laid-Open No. H09-92493

DISCLOSURE OF THE INVENTION

Problem to be Solved By the Invention

The holder of the apparatus of the above-mentioned Documents is for insulating the electrode from the metal frame, but in order to obtain a reliable insulation, the material and thickness must be carefully selected and thus, the cost becomes high.

Means for Solving the Problem

The present invention has been made in view of the above status. According to the present invention, there is provided an apparatus for carrying out plasma processing by introducing a process gas into a discharge space, the plasma processing apparatus comprising:

an electrode having a surface which forms the discharge space, a solid dielectric disposed at said discharge space forming surface; and a casing for receiving the electrode in such a manner as to surround the electrode such that the solid dielectric disposed at the discharge space forming surface is exposed, an in-casing space (out-electrode space) being formed between the casing and the electrode received in the casing, the in-casing space being filled with substantially pure (including inevitable impurities) nitrogen gas.

Owing to the above-mentioned arrangement, insulation between the electrode and the casing can be enhanced without depending on insulating material such as resin, and abnormal discharge can be prevented from occurring. Moreover, the electrode can be adjusted in temperature from outside.

It is preferable that the in-casing space is connected with an introducing passage and an outgoing passage for nitrogen gas.

Owing to this arrangement, even if process gas is permeated into the in-casing space, the process gas can be flowed together with nitrogen gas and discharged through the outgoing passage, and abnormal discharge can be prevented from occurring in the in-casing space. Moreover, temperature adjusting efficiency from outside the electrode can be enhanced.

The nitrogen gas pressure in the in-casing space is preferably higher than the gas pressure in the discharge space.

Owing to this arrangement, the process gas can reliably be prevented from permeating into the in-casing space and abnormal discharge can more reliably be prevented from occurring.

It is preferable that an in-electrode passage for adjusting temperature of the electrode is formed inside the electrode and nitrogen gas is allowed to pass through the in-electrode passage.

Owing to this arrangement, the temperature of the electrode can be adjusted by the same medium both from inside and outside the electrode.

It is preferable that the electrode includes a metal-made plate having a discharge space forming surface and a square pipe disposed at the opposite side surface of this plate to the discharge space forming surface, the inside of the square pipe being provided as the in-electrode passage.

Owing to this arrangement, an electrode having a temperature adjusting internal passage can be manufactured simply and at a low cost.

The present invention is particularly effective for atmospheric pressure plasma processing under the circumstance of a generally atmospheric pressure (near atmospheric pressure). The expression "generally atmospheric pressure" used herein refers to such pressure ranging from $1.013 \times 10^4$ Pa to $50.663 \times 10^4$ Pa. When taken into account of the easiness of pressure adjustment and simplification of the apparatus construction, the range is preferably $1.333 \times 10^4$ Pa to $10.664 \times 10^4$ Pa, and more preferably $9.331 \times 10^4$ Pa to $10.397 \times 10^4$ Pa.

At the time of carrying out the plasma processing, the electrode is heated and tends to elongate. However, in the conventional apparatus as in the above-mentioned Patent Document 1, etc., since elongation and deformation are restricted by the apparatus main body, thermal stress is generated in the electrode and bending occurs. In case the solid dielectric is integrally formed with the electrode by welding or the like, bending also occurs due to difference of linear expansion coefficients of the electrode and the solid dielectric.

In case the solid dielectric is in the shape of a plate and not integrally formed with the electrode, the difference in thermal expansion between those two members is not a big problem but at any rate, the electrode is liable to bend by restriction of the apparatus main body. Then, a gap is formed between the electrode and the solid dielectric plate and arcing is liable to occur in this gap.

It is, therefore, preferable that a bottom part of the casing is open, the solid dielectric is composed of a plate having a strength sufficient enough to support the dead weight of the electrode by itself alone and horizontally supported in such a manner as to close the bottom part of the casing, and the electrode is free at least in a horizontal first direction and placed on an upper surface of the solid dielectric plate in a non-fixed state such that the dead weight of the electrode is almost totally applied to the solid dielectric plate.

The expression "placed in a non-fixed state" used herein refers to a state where the electrode is merely placed on an upper surface of the solid dielectric plate without using such fixing means as adhesion, screwing or the like, and displaceable along the upper surface of the solid dielectric plate.

Owing to this arrangement, the electrode is freely thermally expansible independently from the solid dielectric plate, and can be prevented from being bent and deformed which would otherwise be caused by difference in thermal expansion between the electrode and the solid dielectric plate and restriction of the casing, and in addition, the electrode can be normally contacted with the solid dielectric plate by the pushing force caused by the dead weight of the electrode. By this, arcing can be prevented from occurring between the electrode and the solid dielectric plate. Moreover, thermal stress, which would otherwise be generated due to difference in thermal expansion between the solid dielectric plate and the electrode, can be prevented from occurring to the solid dielectric plate, and the solid dielectric plate can be prevented from being broken.

The electrode may be formed in an elongate shape extending in the first direction. In this case, the electrode is received in the casing such that the electrode is free (displaceable) at least in the longitudinal direction.

Owing to this arrangement, the electrode can be prevented from being bent in the longitudinal direction by thermal expansion reliably, the contacted state between the electrode and the solid dielectric plate can be maintained reliably, and occurrence of arcing and breakage of the solid dielectric plate can be prevented reliably.

The casing is preferably provided with an electrode restricting part for restricting a widthwise position orthogonal to a longitudinal direction of the electrode with play.

Owing to this arrangement, the electrode can be positioned in the widthwise direction to some extent, the electrode is allowed to freely thermally expanded in the widthwise direction, and the electrode can more reliably be prevented from being bent and deformed.

It is preferable that the solid dielectric plate extends in the same direction as the electrode, and the casing is provided with a pair of plate supporters for supporting widthwise both ends of the solid dielectric plate in a manner displaceable in a longitudinal direction. Owing to this arrangement, the solid dielectric plate is also allowed to be freely thermally expanded in the longitudinal direction and more reliably prevented from breakage.

It is also accepted that the solid dielectric plate extends in the same direction as the electrode, widthwise both end faces thereof are each formed as a slant surface facing downward, and the casing is provided with a pair of plate supporters for supporting widthwise both ends of the solid dielectric plate, and each plate supporter includes a slant plate support surface formed facing upward and abutted with the slant surface facing downward of the solid dielectric plate.

It is preferable that at least one of the pair of plate supporters is softer than the solid dielectric plate.

Owing to this arrangement, breakage is more reliably prevented from occurring by easing the supporting stress applicable to the solid dielectric plate.

It is preferable that the solid dielectric plate is made of ceramic, and one of the pair of plate supporters is made of resin (preferably, resin having good corrosion resistance) and the other plate supporter is made of metal.

Owing to this arrangement, the solid dielectric plate can reliably be positioned and supported, and breakage can reliably be prevented from occurring by easing the supporting stress applicable to the solid dielectric plate which is made of ceramic.

It is preferable that the apparatus comprises a processing unit which includes the casing, the electrode and the solid dielectric and that a processing passage is formed between the substrate and the processing unit. It is preferable that a process gas is introduced into the processing passage and at least a part of the processing passage is provided as the discharge space. The processing unit is preferably disposed above the substrate.

On the downstream side of the discharge space between the processing unit and the substrate, those component members, which contact the gas guided out of the discharge space, are corroded easily. For example, in plasma etching using a process gas comprising a fluorine-based gas such as $CF_4$ as a chief component and a small quantity of water or the like added to the chief component, highly corrosive substances such as HF-based gases, ozone and the like are generated by processing reaction taken place in the discharge space. Such corrosive substances flow downstream and contacts the component members of the apparatus so that the component members are corroded. Such corrosion can be a cause of contamination and lower the yield of production.

It is, therefore, preferable that the casing is provided with an upstream member for defining a space connected to the upstream side of the discharge space and a downstream member for defining a space connected to the downstream side of the discharge space, and that the downstream member is made of material having a higher corrosion resistance than that of the upstream member.

Owing to the above arrangement, even if a corrosive gas component is generated by processing reaction in the discharge, the downstream side member, which contacts this corrosive gas component, can be prevented from being corroded, and contamination can be prevented from occurring.

It is preferable that the upstream member is made metal and insulated from the electrode, and the downstream member is made of corrosion-resisting resin.

Owing to the above arrangement, at least the downstream member can be prevented from being corroded reliably.

It is also accepted that the solid dielectric is in the shape of a plate and both upper and lower ends of the solid dielectric are supported by the downstream member.

The corrosion resisting resin may be chiefly composed of at least one component selected from the group consisting of PVDF (poly-vinylidene fluoride), PET (polyethylene terephthalate) and PEEK (polyether ether-ketone), or it may be made of Teflon (registered trademark).

Owing to the above arrangement, corrosion resistance against HF-based gases and ozone can be obtained reliably.

A corrosion resisting coating may be applied to the outer surface on the downstream side of the casing.

Owing to this arrangement, corrosion of the downstream-side part of the casing can be prevented from occurring and thus, contamination can be prevented from occurring reliably.

It is preferable that the electrode is divided into a first metal member and a second metal member, the first metal member being heavier than the second metal member, the second metal member being in the shape of a thin plate, the second metal member is placed on the solid dielectric plate in a non-fixed state, and the first metal member is placed on the second metal member in a non-fixed state. In this case, the material and thickness of the second metal member are preferably set such that a temperature difference between an upper surface and a lower surface of the second metal member becomes a predetermined value or less at the time of plasma discharge.

The predetermined temperature difference is preferably the uppermost temperature difference where the second metal member is hardly bent and deformed at the time of plasma discharge, and it is preferably about one degree centigrade.

The higher the thermal conductivity of the material composing the second metal member is, the larger the thickness of the second metal member can be set. On the contrary, the lower the thermal conductivity is, the larger the thickness of the second metal member must be set.

The second metal member is preferably an aluminum-made flat plate. In case aluminum is used as material of the second metal member, the thickness of the second metal member is preferably set to about 2 mm. As material of the second metal member, aluminum alloy may be used. As material of the second metal member, stainless steel may also be used. In that case, the thickness is preferably about 0.3 to 0.5 mm. The second metal member preferably has, as a minimum requirement, such a thickness as being able to maintain a flat plate shape.

According to the above-mentioned two-member division structure consisting of the first metal member and the second metal member, when the second metal member is thermally expanded by plasma discharge, the temperature difference in the widthwise direction of the second metal member can be made extremely small and the second metal member can be prevented from being bent and deformed. This makes it possible to reliably prevent a gap from being formed between the second metal member and the solid dielectric plate and arcing can reliably be prevented from occurring therebetween. On the other hand, even if the first metal member is bent due to thermal conduction from the second metal member, an electric conductive state can be maintained between the first and second metal members only if the first metal member is contacted with the second member at one spot thereof.

The first metal member preferably has a sufficiently larger weight than the second metal member. Owing to this arrangement, the second metal member can firmly be pushed against the solid dielectric plate by the dead weight of the first metal member, and it can be prevented to form a gap between the second metal member and the solid dielectric plate more reliably.

The first metal member preferably has a temperature adjusting structure (passage, etc. for a coolant and a temperature adjusting medium to pass therethrough). Owing to this arrangement, restraint of thermal expansion of the second metal member and some other things can be made.

The apparatus preferably further comprises a moving mechanism for relatively moving the processing unit with respect to the substrate. (The processing unit includes the casing and the electrode.) The moving direction of the processing unit is preferably along the flowing direction of the gas in the processing passage between the processing unit and the substrate.

When the transfer speed is increased, it is not only that the substantial processing time (time required for plasma being emitted) becomes short but also that the amount of oxygen in the peripheral air caught into the atmospheric pressure plasma discharge space is increased. On the other hand, of all the atmospheric pressure plasma processing, there are those which dislike invasion of oxygen into the discharge space, such as water-repellent processing. In such water-repellent processing, when oxygen is invaded into the discharge space in the water-repellent processing or the like, the processing capacity is lowered. As a countermeasure, if the flow speed of the process gas is increased, the peripheral air can be prevented from being involved into the discharge space and can be pushed back. Since this results in increase of the consumption amount of process gas, it is not desirable from the viewpoint of running cost.

The inventors of the present invention made extensive search and development for high-speed scanning in the so-called direct-type atmospheric pressure plasma processing apparatus in which a substrate is exposed directly to plasma between electrodes. This apparatus was constructed as an atmospheric pressure plasma processing apparatus in which process gas is allowed to flow in a processing passage along the surface of the substrate, a part of the processing passage is formed as a plasma discharge space having a generally atmospheric pressure and the surface of the substrate is plasma processed in the plasma discharge space. The apparatus comprises a processing head including an electrode for forming the discharge space and a substrate opposing surface which is opposed to the substrate to form the processing passage, the substrate opposing surface being provided with a process gas introducing port connected to the upstream end of the processing passage, and a moving mechanism for relatively moving the substrate in the direction (normal or reverse direction of the gas flow in the processing passage) along the processing passage with respect to the processing head. The processing head comprises a single or a plurality of processing units.

FIG. 8 shows the result obtained by water-repellent processing a resist film on a glass substrate using the atmospheric pressure plasma processing apparatus which has the above-mentioned construction. The processing capacity evaluated in terms of contact angle was almost constant when the transfer speed of the substrate was in the range of 0.5 to 3 m/min, while it was markedly lowered when the transfer speed of the substrate was 4 m/min. This phenomenon presumably occurred because the external air is caught into the plasma discharge space by viscosity and the oxygen contained in the air thus caught interferes the reaction for achieving water-repellency.

The inventors of the present invention further carried out their study not only on the transfer speed but also on the gas flow rate and the dimensional construction of the apparatus. As a result, the data shown in Table 1 were obtained.

TABLE 1

| L (mm) | Vf (m/min) | Vs (m/min) | CA (a, U.) |
|--------|-----------|------------|------------|
| 60 | 18.36 | 1.5 | 1.01 |
| 60 | 18.36 | 3.0 | 0.85 |
| 60 | 36.72 | 1.5 | 1.08 |
| 60 | 36.72 | 3.0 | 1.01 |
| 90 | 18.36 | 1.5 | 1.02 |
| 90 | 18.36 | 3.0 | 0.92 |
| 90 | 36.72 | 1.5 | 1.07 |
| 90 | 36.72 | 3.0 | 1.02 |

In Table 1, L represents the distance from the downstream end of the plasma discharge space to the gas exhaust port in the processing passage, i.e., the length (mm) of the downstream side part of the plasma discharge space of the processing passage. A variety of two different lengths were prepared, namely, L=60 mm and L=90 mm.

Vf represents the flow rate of process gas in the processing passage. A variety of two different flow rates were prepared, namely, Vf=306 mm/sec=18.36 m/min and Vf=612 mm/sec=36.72 m/min.

Vs represents the transfer speed by the moving mechanism. A variety of two different transfer speeds were prepared, namely, Vs=25 mm/sec=1.5 m/min and Vs=50 mm/sec=3.0 m/min. The processing head was fixed and the substrate was transferred in a direction (direction opposite to the flow of process gas in the processing passage) toward the introducing port from the gas exhaust port.

CA represents the contact angle of the surface of the substrate after water-repellent processing is over.

Other conditions were as follows.

Process gas: $N_2+CF_4$

Gap between the lower surface of the processing head and the substrate: 1.0 mm

FIG. 9 shows Table 1 by means of a graph. The abscissa of FIG. 9 is allotted with L×Vf/Vs (unit: mm).

From the above result, the following expression 1a was guided as conditions for obtaining sufficient processing capacity.

$$k=L \times Vf/Vs>700 \qquad \text{(expression 1a)}$$

It is more preferable that the following expression 2a is satisfied.

$$k=L \times Vf/Vs>1400 \qquad \text{(expression 2a)}$$

The data of Table 1 and FIG. 9 were obtained in the atmospheric environment and the concentration of oxygen contained in the peripheral air caught in the plasma discharge space was about 20%. On the other hand, if the concentration of oxygen contained in the peripheral air is changed, the amount of oxygen caught in the plasma discharge space is also changed in accordance therewith. Thus, the lower limit value of the above-mentioned k is changed.

If the concentration of oxygen contained in the peripheral air is also taken into consideration, the expressions 1a and 2a can be rewritten to as the following expressions 1 and 2, respectively.

$$k=L \times Vf/Vs>700 \times r \qquad \text{(expression 1)}$$

$$k=L \times Vf/Vs>1400 \times r \qquad \text{(expression 2)}$$

wherein r represents the ratio of the concentration of oxygen contained in the peripheral air (strictly, the concentration of oxygen contained in gas excluding the process gas at the gas exhaust port) with respect to the concentration of oxygen (about 20%) contained in the atmospheric air.

Thus, it is preferable that the following relation is satisfied.

$$L \times Vf/Vs>700 \times r \qquad \text{(expression 1)}$$

It is more preferable that the following relation is satisfied.

$$L \times Vf/Vs>1400 \times r \qquad \text{(expression 2)}$$

wherein;

L: distance from the downstream end of the discharge space to the gas exhaust port, that is, the length (mm) of the passage part on the downstream side of the discharge space in the processing passage Vf: flow rate of process gas in the processing passage Vs: transfer speed by the moving mechanism r: ratio of the concentration of oxygen contained in gas excluding the process gas at the gas exhaust port with respect to the concentration of oxygen contained in the atmospheric air By this, the peripheral air can be prevented or suppressed from being caught into the processing passage and the processing capacity can be maintained without increasing the amount of consumption of the process gas event when the transfer speed Vs is increased only if the distance L from the downstream end of the discharge space to the gas exhaust port is set large.

The moving mechanism relatively moves the substrate in the flow direction of gas in the discharge space with respect to the processing unit.

The processing unit includes the casing and the electrode.

The gas exhaust port is disposed at the side of the casing, and gas from the discharge space is taken into the gas exhaust port.

The transfer speed Vs by the moving mechanism is preferably Vs>2 m/min and more preferably Vs>4 m/min. According to the present invention, not only under scanning of Vs>2 m/min but also under high speed scanning of Vs>4 m/min, the peripheral air can be prevented or suppressed from being caught into the processing passage reliably and the processing capacity can be maintained reliably.

The process gas in case of water-repellent processing is preferably a gas chiefly containing a carbon fluoride compound, such as $CF_4$, which further preferably contains nitrogen.

It can be contemplated that the nearer to the discharge space the position is, the more reduced the concentration of oxygen at the downstream side part of the processing passage is.

In the water-repellent processing, the concentration of oxygen at the discharge space is required to be 100 ppm or less. It is preferable, therefore, to set the above-mentioned L, Vf, Vs and r such that the concentration of oxygen at the downstream end of the discharge space becomes 100 ppm or less. By doing so, the processing capacity in the water-repellent processing can be obtained reliably.

It is preferable that the processing unit is provided with a curtain gas blow-out part on the opposite side of the processing passage with the gas exhaust port disposed therebetween, so that r is adjusted by the flow rate of process gas in the processing passage, the flow rate of curtain gas coming through the blow-out part and the flow rate of exhaust gas outgoing through the gas exhaust port.

As mentioned above, in the water-repellent processing or the like carried out under generally atmospheric pressure, when the peripheral air is caught, the processing capacity is lowered at the end part on the downstream side of the processing passage by oxygen contained in the peripheral air thus caught. However, there are some other cases as the cleaning processing or the like, in which the processing capacity is more enhanced in case a small amount of oxygen is mixed in the processing gas than in case the concentration of oxygen is zero.

Therefore, it is also accepted that at the time of carrying out plasma processing on the substrate while relatively reciprocally moving the processing unit (including the casing and the electrode) with respect to the substrate, the direction of flow of the process gas in the processing passage between the processing unit and the substrate is switched in accordance with the relative movement direction of the processing unit.

In the processing (for example, in the water-repellent processing) for preventing, as much as possible, the peripheral air from being caught into the processing passage, the following operation is preferable.

When the processing unit is relatively moved in the forward direction, the process gas is introduced into the processing passage from the end part on the forward direction side of the processing passage. Introduction of process gas from the end part on the backward direction side of the processing passage is almost completely stopped, preferably strictly completely stopped. Owing to this arrangement, the process gas flows from the end part on the forward direction side of the processing passage to the end part of the backward direction side. When the relative movement direction of the processing unit is reversed from the forward direction to the backward direction, the main introducing position of the process gas is switched from the end part on the forwarding direction side of the processing passage to the end part of the backward direction. When the processing unit is relatively moved in the backward direction, the process gas is introduced into the processing passage from the end part on the backward direction side of the processing passage. The introduction of process gas from the end part on the forward direction side of the processing passage is almost completely stopped, preferably strictly completely stopped. Owing to this arrangement, the process gas flows from the end part on the backward direction side of the processing passage toward the end part on the forward direction side. When the relative movement direction of the processing unit is reversed from the backward direction to the forward direction, the main introducing position of the process gas is switched from the end part on the backward direction side of the processing passage to the end part on the forward direction side.

In a process (for example, cleaning process) for allowing a small amount of peripheral air to be caught into the processing passage, the following operation is preferable.

When the processing unit is relatively moved in the forward direction, the process gas is introduced into the processing passage from the end part on the backward direction side of the processing passage. The introduction of process gas from the end part on the forward direction side of the processing passage is almost completely stopped, preferably strictly completely stopped. Owing to this arrangement, the process gas flows from the end part on the backward direction side of the processing passage toward the end part on the forward direction side. When the relative movement direction of the processing unit is reversed from the forward direction to the backward direction, the main introducing position of the process gas is switched from the end part on the backward direction side of the processing passage to the end part on the forward direction side. When the processing unit is relatively moved in the backward direction, the process gas is introduced into the processing passage from the end part on the forward direction side of the processing passage. The introduction of process gas from the end part on the backward direction side of the processing passage is almost completely stopped, preferably strictly completely stopped. Owing to this arrangement, the process gas flows from the end part on the forward direction side of the processing passage toward the end part on the backward direction side. When the relative movement direction of the processing unit is reversed from the backward direction to the forward direction, the main introducing position of the process gas is switched from the end part on the forward direction side of the processing passage to the end part on the backward direction side.

Of the end part on the forward direction side of the processing passage and the end part on the backward direction, the end part on the opposite side of the end part serving as the introducing position of the process gas may be sucked and exhausted. In that case, the sucking and exhausting position is preferably switched in parallel with the switching of the process gas introducing position.

For example, in the processing (for example, water-repellent processing) where the peripheral air is prevented from being caught into the processing passage as much as possible, the following operation is preferable.

When the processing unit is relatively moved in the forward direction, the process gas is introduced into the processing passage from the end part on the forward direction side of the processing passage and sucked and exhausted from the end part on the backward direction side of the processing passage. The suction and exhaustion from the end part on the forward direction side of the processing passage may be strictly completely stopped or may be allowed only by a small amount (smaller amount than the suction and exhaustion on the backward direction side). Owing to this arrangement, the process gas flows from the end part on the forward direction side of the processing passage toward the end part on the backward direction side reliably. On the other hand, when the processing unit is relatively moved in the backward direction, the process gas is introduced into the processing passage from the end part on the backward direction side of the processing passage and sucked and exhausted from the forward direction side of the processing passage. The suction and exhaustion from the end part on the backward direction side of the processing passage may be strictly completely stopped or may be allowed only by a small amount (smaller amount than the suction and exhaustion on the forward direction side). Owing to this arrangement, the process gas flows from the end part on the backward direction side of the processing passage toward the end part on the forward direction side reliably.

In the processing (for example, cleaning processing) where a small amount of the peripheral air is allowed to be caught into the processing passage, the following operation is preferable.

When the processing unit is relatively moved in the forward direction, the process gas is introduced into the processing passage from the end part on the backward direction side of the processing passage and sucked and exhausted from the end part on the forward direction side of the processing passage. The suction and exhaustion from the end part on the backward direction side of the processing passage may be strictly completely stopped or may be allowed only by a small amount (smaller amount than the suction and exhaustion on the forward direction side). Owing to this arrangement, the process gas flows from the end part on the backward direction side of the processing passage toward the end part on the forward direction side reliably. When the processing unit is relatively moved in the backward direction, the process gas may be introduced into the processing passage from the end part on the forwarding direction of the processing passage and sucked and exhausted from the end part on the backward direction of the processing passage. The suction and exhaustion from the end part on the forward direction side of the processing passage may be completely stopped or may be allowed only by a small amount (smaller amount than the suction and exhaustion on the backward direction side). Owing to this arrangement, the process gas flows from the end part on the forward direction side of the processing passage toward the end part on the backward direction side reliably.

Of the end part on the forward direction side of the processing passage and the end part on the backward direction, a gas curtain may be formed outside the end part serving as the introducing position mainly for the process gas. In that case, the main gas curtain forming position may be switched in parallel with the switching of the process gas introducing position.

For example, in the process (for example, water-repellent processing) where the peripheral air is prevented from being caught into the processing passage as much as possible, when the processing unit is relatively moved in the forward direction, the process gas may be introduced into the processing passage from the end part on the forward direction side of the processing passage and a gas curtain may be formed on the outer side in the forward direction of the process gas introducing position, and when the processing unit is relatively moved in the backward direction, the process gas may be introduced into the processing passage from the end part on the backward direction side of the processing passage and a gas curtain may be formed on the outer side in the backward direction of the process gas introducing position.

In the processing (for example, cleaning processing) where a small amount of the peripheral air is allowed to be caught into the processing passage), when the processing unit is relatively moved in the forward direction, the process gas may be introduced into the processing passage from the end part on the backward direction side of the processing passage and a gas curtain may be formed on the outer side in the backward direction of the process gas introducing position, and when the processing unit is relatively moved in the backward direction, the process gas may be introduced into the processing passage from the end part on the forward direction side of the processing passage and a gas curtain may be formed on the outer side in the forward direction of the process gas introducing position.

The switching of the process gas introducing position, the switching of the gas exhausting position and the switching of the gas curtain forming position may be combined. On the end part on the gas curtain forming side, a sucking operation for sucking and exhausting the curtain gas may be carried out.

As an apparatus construction corresponding to the above-mentioned switching method, it is preferable that the processing unit (including the casing and the electrode) is provided at both end parts thereof along the processing passage with a pair of introducing nozzles for introducing process gas into the processing passage, the apparatus further comprises:

a moving mechanism for relatively reciprocally moving the processing unit in the opposing direction of the pair of introducing nozzles with respect to the substrate, and introducing nozzle switch means for selectively connecting one of the pair of introducing nozzles to a process gas source in accordance with moving direction of the introducing nozzle by the moving mechanism.

In the process (for example, the water-repellent processing) where the peripheral air is prevented from being caught into the processing passage as much as possible, it is preferable that the introducing nozzle switch means select the introducing nozzle on the end part on the forward direction side of the processing passage and connects the same to the process gas source when the processing unit is relatively moved in the forward direction, and it is preferable that the introducing nozzle switch means selects the introducing nozzle of the end part on the backward direction side and connects the same to the process gas source when the processing unit is relatively moved in the backward direction.

In the processing (for example, the cleaning processing) where a small amount of the peripheral air is allowed to be caught into the processing passage, it is preferable that the introducing nozzle switch means selects the introducing nozzle of the end part on the backward direction side of the processing passage and connects the same to the process gas source when the processing unit is relatively moved in the forward direction and it is preferable that the introducing nozzle switch means selects the introducing nozzle of the end part on the forward direction side of the processing passage and connects the same to the process gas source when the processing unit is relatively moved in the backward direction.

It is preferable that the processing unit is provided at both side parts thereof with a pair of gas exhaust nozzles and the apparatus comprises a gas exhaust nozzle switch means adapted to select the gas exhaust nozzle on the opposite side of the introducing nozzle selected in accordance with the moving direction by the moving mechanism and connect the same to a gas exhaust device.

The gas exhaust nozzle may be arranged outside the introducing nozzle or it may be arranged inside the introducing nozzle. The gas exhaust nozzle on the side not selected by the gas exhaust nozzle switch means is preferably shut off from the gas exhaust device.

It is also accepted that the processing unit is provided outside the pair of introducing nozzles with a pair of gas exhaust nozzles connected to the gas exhaust device, and the apparatus further comprises gas exhaust nozzle adjusting means adapted to relatively increase the sucking amount of the gas exhaust nozzle on the opposite side of the introducing nozzle selected in accordance with the moving direction by the moving mechanism and relatively reduce the sucking amount of the gas exhaust nozzle on the same side as the selected introducing nozzle.

It is preferable that the processing unit is provided outside the pair of introducing nozzles with a pair of curtain nozzles for forming a gas curtain, and the apparatus further comprises curtain nozzle switch means adapted to select the curtain nozzle on the same side as the introducing nozzle selected in accordance with the moving direction by the moving mechanism and connect the same to the curtain gas source. It is preferable that the curtain nozzle on the side not selected by the curtain nozzle switch means is shut off from the curtain gas source.

Effect of the Invention

According to the present invention, insulation between the electrode and the casing can be enhanced, abnormal discharge can be prevented from occurring, and the electrode can be adjusted in temperature from outside.

BRIEF DESCRIPTION OF DRAWINGS

FIG. 1 shows an atmospheric pressure plasma processing apparatus according to a first embodiment of the present invention and is a front sectional view taken on line I-I of FIG. 2.

FIG. 2 is a side sectional view, taken on line II-II of FIG. 1, of the above-mentioned atmospheric pressure plasma processing apparatus.

FIG. 3 is a front sectional view showing a processing passage on the left side of the above-mentioned atmospheric pressure plasma processing apparatus on an enlarged scale.

FIG. 4 is a perspective view showing a modification of the electrodes of the above-mentioned atmospheric pressure plasma processing apparatus.

FIG. 5 is a perspective view showing another modification of the electrodes of the above-mentioned atmospheric pressure plasma processing apparatus.

FIG. 6 is a front view schematically showing one embodiment of a water-repellent atmospheric pressure plasma processing apparatus.

FIG. 7 is a front view schematically showing another embodiment of the water-repellent atmospheric pressure plasma processing apparatus.

FIG. 8 is a graph showing the post-processing contact angles with respect to the transfer speeds when a resist film on the glass substrate is subjected to water-repellent processing in a searching process for obtaining preferable setting conditions (expressions 1 and 2) in the water-repellent atmospheric pressure plasma processing.

FIG. 9 is a graph showing the water-repellent post-processing contact angles in case the length of a downstream side part of the processing passage, the flow rate of the process gas in the processing passage and the transfer speed are adjusted respectively, in a searching process for obtaining preferable setting conditions (expressions 1 and 2) in the water-repellent atmospheric pressure plasma processing.

FIG. 10 is a front explanatory view schematically showing one embodiment of a water-repellent atmospheric pressure plasma processing apparatus which includes means for switching a process gas introducing position.

FIG. 11 is a front explanatory view showing the state of a gas flow when the processing unit of the embodiment of FIG. 10 is moving in the left direction with respect to the substrate.

FIG. 12 is a front explanatory view showing the state of a gas flow when the processing unit of the embodiment of FIG. 10 is moving in the right direction with respect to the substrate.

FIG. 13 is a front explanatory view schematically showing another embodiment of a water-repellent atmospheric pressure plasma processing apparatus which includes means for switching a process gas introducing position.

[FIG. 14]

FIG. 14 is a front explanatory view showing the state of gas flow when the processing unit of the embodiment of FIG. 13 is moving in the left direction with respect to the substrate.

[FIG. 15]

FIG. 15 is a front explanatory view showing the state of gas flow when the processing unit of the embodiment of FIG. 13 is moving in the right direction with respect to the substrate.

DESCRIPTION OF REFERENCE NUMERAL

Figure 1:
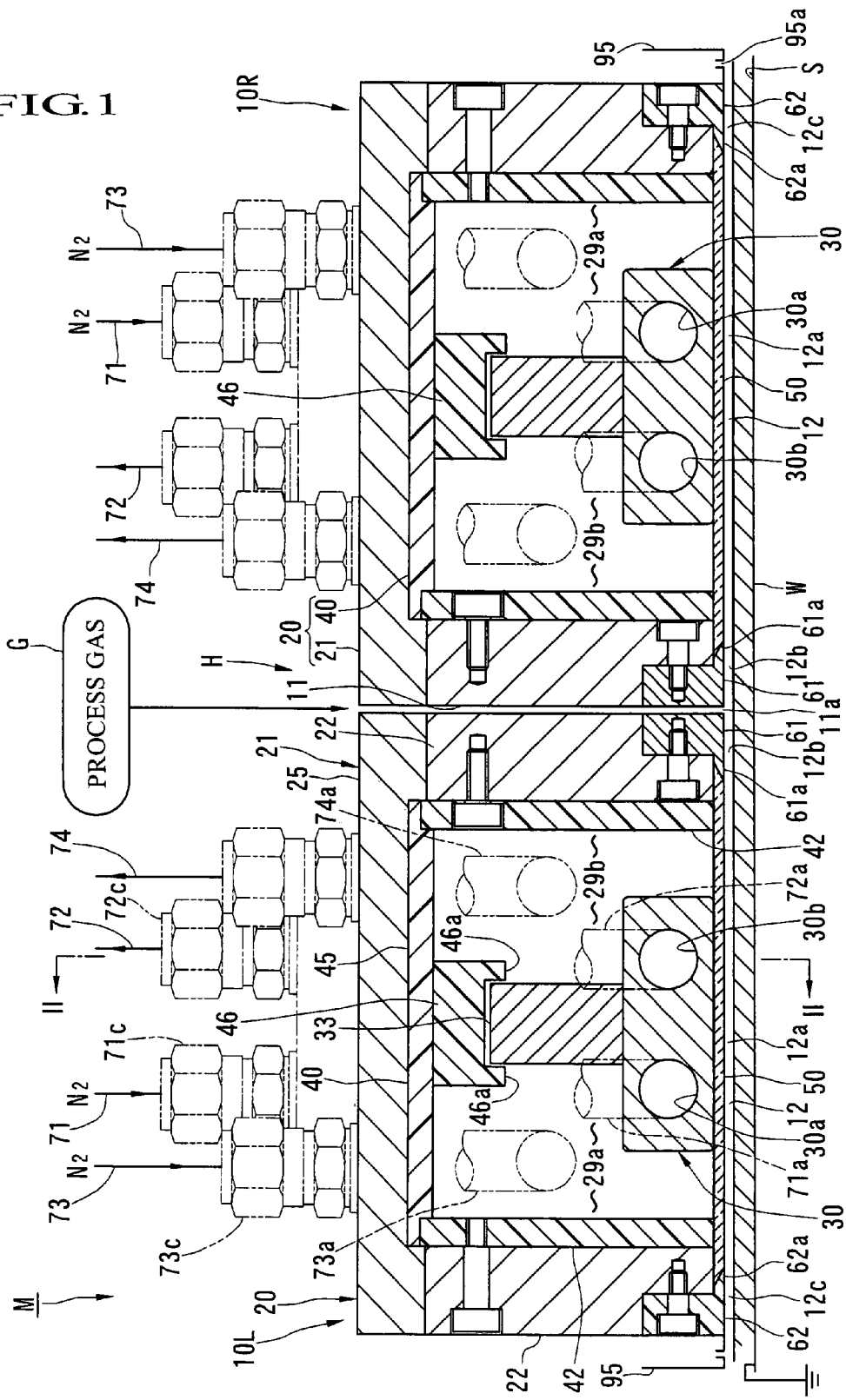
[FIG. 1]

M . . . plasma processing apparatus
P . . . moving mechanism
G . . . process gas source
H . . . processing head
L . . . length of a downstream side part of a processing passage (distance from a downstream end of a discharge space to a gas exhaust port)
S . . . stage
W . . . substrate
10L, 10R . . . processing units
11 . . . plasma gas introducing passage
12 . . . processing passage
12a . . . discharge space
12b . . . space connected to the upstream side of the discharge space in the processing passage (upstream side part of the processing passage)
12c . . . space connected to the downstream side of the discharge space in the processing passage (downstream side part of the processing passage)
20 . . . casing
29, 29a, 29b . . . in-casing spaces
30 . . . electrode
30a, 30b . . . in-electrode passages
31 . . . square pipe
32U, 32L . . . flat plates
34 . . . first metal member
35 . . . second metal member
46a . . . electrode restricting part
50 . . . solid dielectric plate
61 . . . upstream-side metal-made support member (upstream member)
61a . . . upstream-side plate supporter
62 . . . downstream-side resin-made support member (downstream member)
62a . . . downstream-side plate supporter
73a . . . nitrogen introducing passage
74a . . . nitrogen outgoing passage
80 . . . process gas feed system
82 . . . common feed passage
83 . . . electromagnetic three-way valve (introducing nozzle switch means)
84L . . . individual feed passage
84R . . . individual feed passage
85L . . . gas introducing nozzle
85R . . . gas introducing nozzle
90 . . . gas exhaust system
91 . . . gas exhaust means
92 . . . common gas discharge passage
93 . . . electromagnetic three-way valve (gas exhaust nozzle switch means)
93L, 93R . . . electromagnetic flow rate control valves (gas exhaust nozzle adjusting means)
94L, 94R . . . individual gas exhaust passages
95 . . . gas exhaust cylinder
95a . . . gas exhaust port
95L, 95R . . . gas exhaust nozzles
100 . . . curtain gas feed system
101 . . . curtain gas source
102 . . . common feed passage
103 . . . electromagnetic three-way valve (curtain nozzle switch means)
104L, 104R . . . individual feed passages
105, 105L, 105 . . . curtain nozzles (curtain gas blowout parts)

BEST MODE FOR CARRYING OUT THE INVENTION

A first embodiment of the present invention will be described hereinafter with reference to the drawings.

As shown in FIG. 1, an atmospheric pressure plasma processing apparatus M comprises a processing head H and a stage S. The processing head H is fixed to and supported by an apparatus frame (not shown). The processing head H includes two (plural) left and right processing units 10. A small gap 11 is formed between the two processing units 10. The thickness of the gap 11 is, for example, about 1 mm. A process gas source G is connected to an upper end part of this gap 11. The gap 11 is provided as a process gas introducing passage. A lower end opening 11a of the gap 11 is provided as an introducing port for introducing a process gas to a processing passage 12 as later described. The process gas uses gas species suitable to the contents of processing. For example, in etching processing, a mixing gas or the like is used, which is composed of a fluorine-based gas such as $CF_4$ as a main component and a small quantity of water or the like added to the fluorine-based gas.

Gas exhaust cylinders 95 are respectively disposed on both left and right sides of the processing heads H. The lower surface of each gas exhaust cylinder 95 is flush with the lower surface of the processing head H. The lower end face of the gas exhaust cylinder 95 may be non-flush with the lower surface of the processing head H.

A slit-like gas exhaust port 95a is formed in the lower surface of the gas exhaust cylinder 95. Though not shown, an upper end part of the gas exhaust cylinder 95 is connected to gas exhaust means such as a suction pump.

Figure 3:
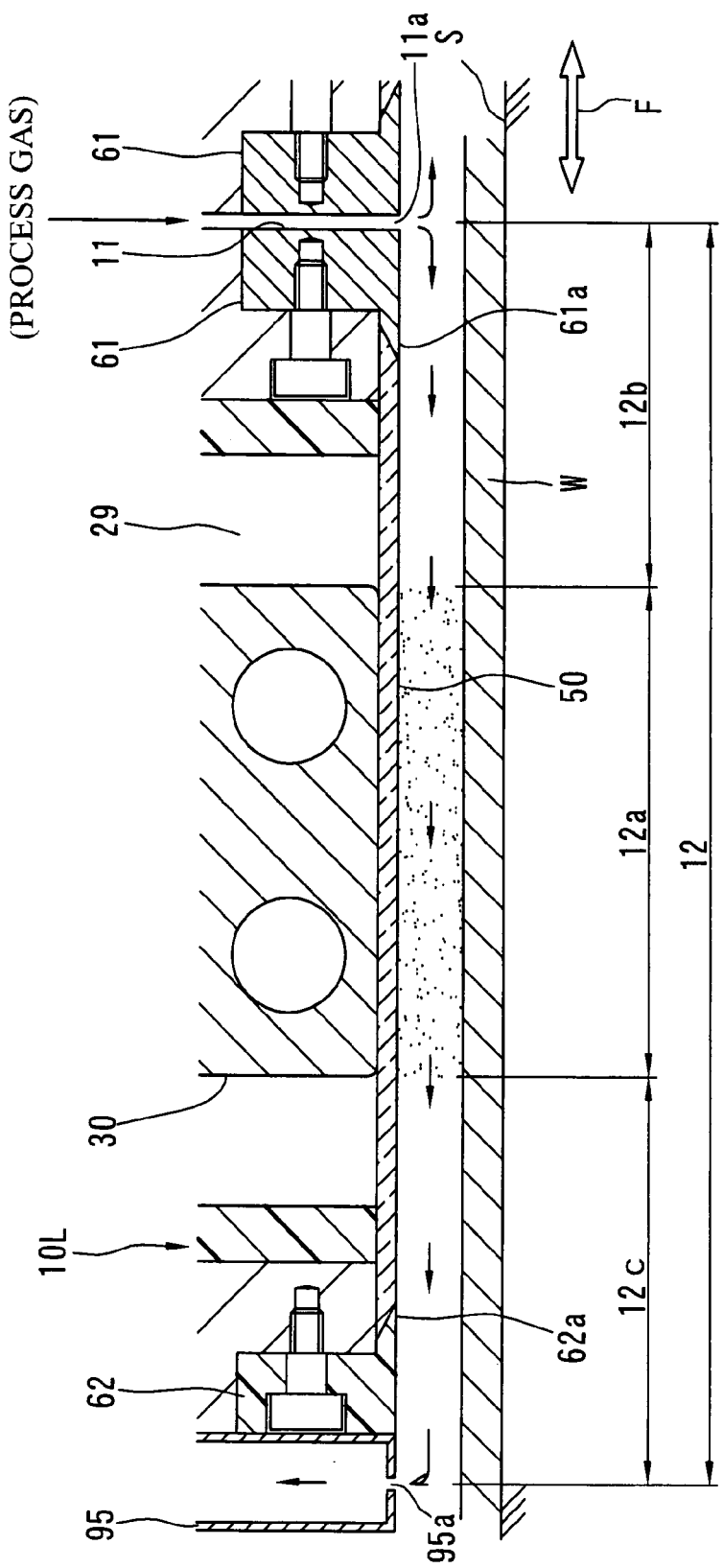
[FIG. 3]

The stage S is disposed under the processing head H. The stage S is electrically grounded and constitutes an earth electrode (second electrode) for an application electrode 30 as later described. The stage S is connected with a moving mechanism F (FIG. 3). By this moving mechanism F, the stage S is moved in the left and right direction. It is also accepted that the stage S is fixed and the processing head H is movable.

A substrate W to be processed is set on the upper surface of the stage S. Owing to this arrangement, a processing passage 12 directing in the left and right direction from the central part is formed between the processing head H and the substrate W. The thickness (working distance) of the processing passage 12 is, for example, 1 mm to 2 mm.

The substrate W may be directly electrically grounded.

The two processing units 10, 10 are bilaterally symmetrical with each other. The two processing units 10L, 10R may be different in configuration, dimension, structure, etc. from each other. Hereinafter, in case the two processing units 10 are required to be distinguished from each other, the left-side processing head 10 is attached with R and the right-side processing head 10 is attached with L. Description will be made hereinafter on the left-side processing unit 10L unless otherwise specifically stated.

Figure 2:
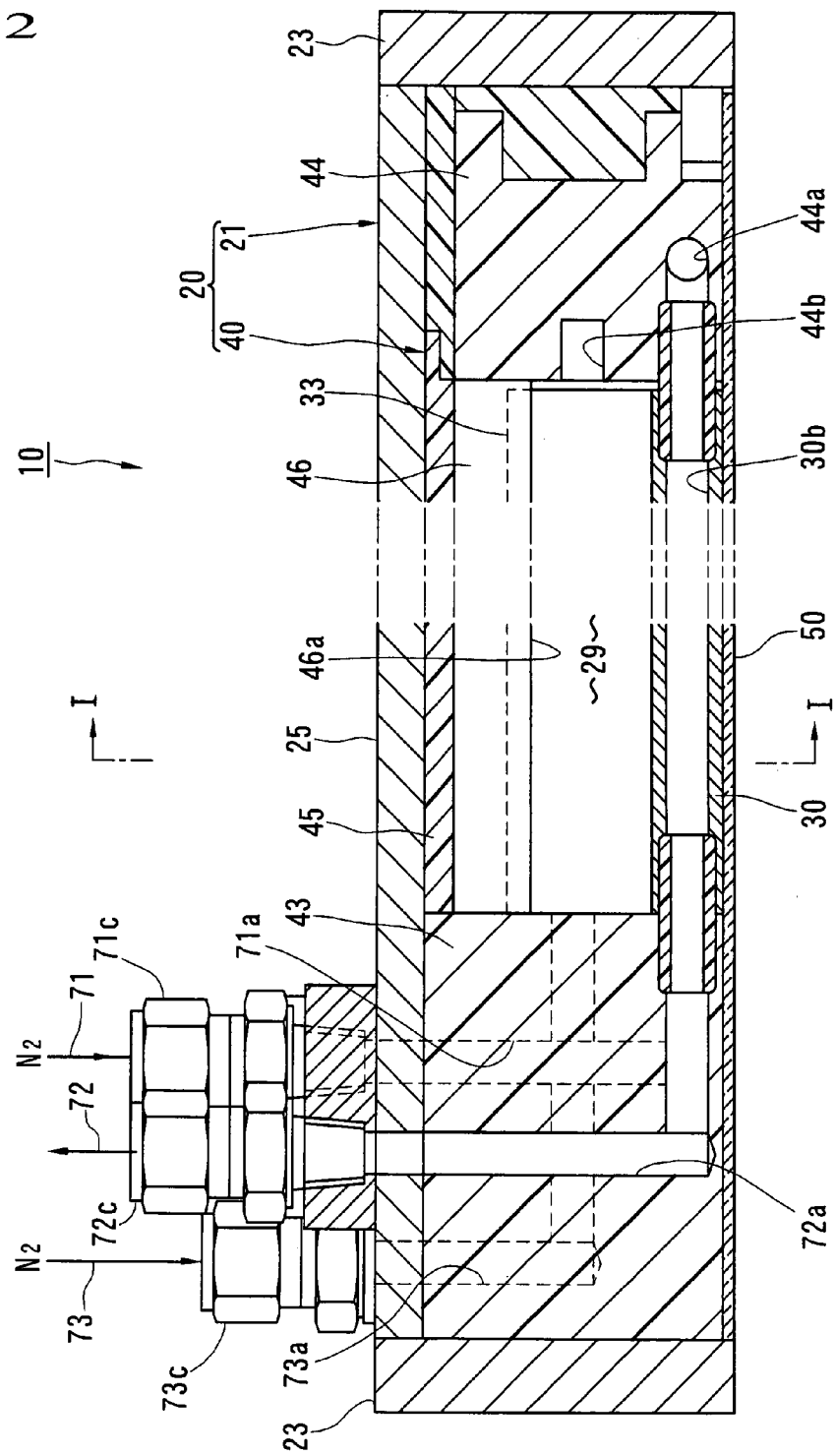
[FIG. 2]

As shown in FIGS. 1 and 2, the processing unit 10 comprises a casing 20 as a main body and a first electrode 30 received in the casing 20. The processing unit 10 extends long in a back and forth direction (orthogonal direction to the paper surface of FIG. 1, and left and right direction of FIG. 2).

The casing 20 includes a casing main body 21 supported by a support frame not shown, and a lining member 40 disposed at the inner peripheral surface of the casing main body 21.

The casing main body 21 includes left and right walls 22, front and rear walls 23 and an upper plate 25. The bottom part of the casing main body 21 is open. Those component members 22, 23, 25 of the casing main body 21 are made of metal such as stainless steel. An external width in the left and right direction of the casing main body 21 is, for example, about 100 m and the length in its back and forth direction is, for example, 2 m or more.

The lining member 40 includes inner wall parts 42 disposed at inner surfaces of the left and right walls 22 of the casing main body 21, inner wall parts 43, 44 disposed at inner surfaces of the front and rear walls 23, and a ceiling part 45 disposed at a lower side of an upper plate 25. Those component members 42, 43, 44, 45 of the inner wall member 40 are made of insulating material such as resin.

A solid dielectric plate 50 made of ceramic such as alumina or quartz is disposed at a lower part of the casing main body 21. The solid dielectric plate 50 is in a thin plate-like shape extending long in the back and forth direction. The thickness of the solid dielectric plate 50 is, for example, about 2 mm, its width is, for example, about 60 mm and its length is almost equal to that of the casing 20 and 2 meters or more. The bottom part of the casing main body 21 is blocked with this solid dielectric plat 50.

The solid dielectric plate 50 is supported in the following manner.

As shown in FIGS. 1 and 3, both end faces in the widthwise direction of the solid dielectric plate 50 is formed as a slant surface facing downward. A pair of plate support members 61, 62 are fixedly bolted to lower end parts of the left and right walls 22 of the casing main body 21. Plate supporters 61a, 62a protruding in the mutually opposing directions are disposed at lower end parts of the plate support members 62, 62, respectively. End faces of the plate supporters 61a, 62a are each formed as a slant surface facing upward. The slant end faces facing downward of the solid dielectric plate 50 are abutted with the slant end faces (plate supporting surfaces) facing upward of the plate supporters 61a, 62a, respectively. Owing to this arrangement, the solid dielectric plate 50 is horizontally supported in such a manner as to be laid over between the plate support members 61, 62 on both sides. The solid dielectric plate 50 is displaceable in the longitudinal direction in such the supported state. A clearance for allowing displacement is formed between a front or rear end part of the solid dielectric plate 50 and an inner wall part 43 or 44 of the casing 20.

Left and right side parts of the upper surface of the solid dielectric plate 50 are abutted with lower end faces of the left and right walls 22 of the casing main body 21. Though not shown, a seal member (not shown) is interposed between the solid dielectric plate 50 and the lower end face of the wall 22.

The plate support member 61 on the right side (upstream side part of the processing passage 12) of the processing unit 10L is made of same metal (for example, stainless steel) as the casing main body 21. The plate support member 62 on the left side (downstream side part of the processing passage 12) of the processing unit 10L is made of resin. The resin material composing the plate support member 62 is preferably of the type having good corrosion resistance against corrosive substances such as ozone, HF-based gases and the like. Such resin is preferably Teflon (registered trademark)-based resin and more preferably PVDF (poly-vinylidene fluoride). PET (polyethylene terephthalate) is acceptable and PEEK (poly-ether-ether-ketone) is also acceptable. The resin-made plate support member 62 is, of course, softer than the metal-made plate support member 61 and is softer than the ceramic-made solid dielectric plate 50.

As shown in FIG. 3, a lower surface on the right-side part of the solid dielectric plate 50 and a lower surface of the metal-made plate support member 61 cooperate with the substrate W to define a passage part 12b which is on the more upstream side of a discharge space 12a as later described in the processing passage 12. The upstream-side passage part 12b occupies the processing passage 12 ranging from the process gas introducing port 11a to the upstream end of the discharge space 12a.

A lower surface of the left-side part of the solid dielectric plate 50 and a lower surface of the corrosion resistant resin-made plate support member 62 cooperate with the substrate W to define a passage part 12c which is on the more downstream side of a discharge space 12a as later described in the processing passage 12. The downstream side passage part 12c occupies the processing passage 12 ranging from the downstream end of the discharge space 12a to the air exhaust port 95a.

Next, the electrode 30 in the processing unit 10 will be described.

As shown in FIGS. 1 and 2, the electrode 30 is made of metal such as aluminum or stainless steel and extends long in the back and forth horizontal directions in a square shape in section. The length of this electrode 30, is, for example about 2 meters. A rib 33 is disposed at an upper part of the electrode 30. Means for fixing the rib 33 to the electrode 30 is a bolt (not shown) or the like. The rib 33 extends in the same direction as the electrode 30, reinforces the electrode 30 and prevents the bending of the electrode 30. The rib 33 is made of metal (stainless steel or the like) same as the electrode 30 and electrically integral with the electrode 30, though not show, a power feed wire projects form the rib 33, and a power feed wire extends from the power feed pin and connected to a power source. Owing to this arrangement, power is fed to the electrode 30. By the power thus fed, an atmospheric pressure glow discharge generates between the electrode 30 and the substrate W, etc. located under the electrode 30 and serving as a ground electrode (i.e., at the central part 12a of the processing passage 12), so that the central part 12a of the processing passage 12 functions as a discharge space. The lower surface of the electrode 30 functions as a "discharge space forming surface (glow-discharging surface)".

The power source is of the type common to the two processing units 10L, 10R.

The weight per unit length of the electrode 30 (including the rib 33) is, for example, 30 to 60 g/cm. This electrode 30 is received in the casing 20 and merely placed on the upper surface of the solid dielectric plate 50 in a non-fixed state. Due to the foregoing arrangement, the dead weight of the electrode 30 (including the rib 33) is totally applied to the solid dielectric plate 50. By this pushing force caused by the dead weight of the electrode 30, the entire flat lower surface of the electrode 30 is closely pushed against the flat upper surface of the solid dielectric plate 50. The solid dielectric plate 50 made of ceramic having a thickness of 2 mm has strength sufficient enough to withstand the load of the electrode 30.

The front end part of the electrode 30 is positioned by the inner wall part 43 on the front side of the casing 20. A clearance is formed between the rear end part of the electrode 30 and the inner wall part 44 on the rear side of the casing 20. Owing to this arrangement, the electrode 30 is free in the longitudinal direction and thermally expansible and contractible.

An electrode restricting member 46 made of insulating resin is hang from the ceiling part 45 of the casing 20. A pair of left and right electrode restricting parts 46a are disposed at the lower surface of the electrode restricting member 46 in such a manner as to project downward. An upper end part of the rib 33 is inserted between those left and right electrode restricting parts 46a. Some degree (for example, about 0.5 mm) of play is provided between the electrode restricting parts 46a and the rib 33. The left and right electrode restricting parts 46a restrict the position in the left and right direction of the electrode 30 while allowing such play.

Two passages 30a, 30b are formed in the electrode 30. Those in-electrode passages 30a, 30b are arranged, side by side, in parallel relation with each other and extend back and forth over the entire length of the electrode 3. The end part on the front side (left side in FIG. 2) of the in-electrode passage 30a is connected to a nitrogen feed pipe 71 through a nitrogen introducing passage 71a formed at the front-side inner wall part 43 and the upper plate 25 and through a nitrogen introducing connector 71c. The nitrogen feed pipe 71 is connected to a nitrogen gas source not shown. A substantially pure (including inevitable impurities) nitrogen gas is stored in the nitrogen gas source in a compressed state. The end part on the rear side of the in-electrode passage 30a is communicated with the end part on the rear side of the in-electrode passage 30b through a communicating passage 44a formed in the rear-side inner wall part 44. The end part on the front side of the in electrode passage 30b is connected to a nitrogen recovering passage 72 through a nitrogen outgoing part 72a formed at the front-side inner wall part 43 and the upper plate 25 and through a nitrogen outgoing connector 72c.

An in-casing space 29 is defined between the lining member 40 of the casing 20 and the electrode 30. The in-casing space 29 is divided into two with the electrode 30 (including the rib 33) and the electrode restricting member 46 therebetween. When it is necessary to distinguish the two spaces in the casing 20, one from the other, the reference numeral is assigned with "a" or "b". The end part on the front side of the left-side in-casing space 29a in the processing unit 10L is connected to a nitrogen feed pipe 73 through the nitrogen introducing passage 73a formed at the front-side inner wall part 43 and the upper plate 25 and through the nitrogen introducing connector 73c. The nitrogen feed pipe 73 is connected to the nitrogen gas source. The end part on the rear side of the in-casing space 29a is connected to the end part on the rear side of the right-side in-casing space 29b through a communicating passage 44b formed in the inner wall part 44 on the rear side. The end part on the front side of the in-casing space 29b is connected to a nitrogen recovering passage 74 through the nitrogen outgoing passage 74a formed at the front side inner wall part 43 and the upper plate 25 and through a nitrogen outgoing connector 74c.

At the time of plasma processing the substrate W by the plasma processing device M having the above-mentioned construction, the substrate W is arranged under the processing units 10L, 10R, and a process gas including $CF_4$, etc. of the process gas source G is delivered into the gas introducing passage 11. This process gas is branched into the left and right processing passages 12 through the gas introducing passage 11 and flowed to a central part 12a via the upstream-side part 12b of the processing passage 12. In parallel therewith, voltage is fed to the electrode 30 from the power source. By doing so, the central part 12a of the processing passage 12 is turned out to be an atmospheric pressure plasma discharge space and the process gas can be plasmatized therein. The process gas thus plasmatized is brought into contact with the surface of the substrate W, so that the substrate W is subjected to such plasma processing as etching under the atmospheric pressure.

By this processing reaction, corrosive substances such as ozone and HF-based gases are generated. The processed gas containing such corrosive substances passes through the passage 12c on the downstream side of the discharge space 12a and then, it is sucked into the gas exhaust cylinder 95 through the gas exhaust port 95a and exhausted. Since the plate support member 62 defining the downstream-side passage 12c has a corrosion resisting property, it is not corroded even if it is exposed to the corrosive substances. This makes it possible to prevent the occurrence of contamination.

The electrode 30 is heated by the above-mentioned discharge and tends to expand mainly in the longitudinal direction. Since this electrode 30 is made free in the longitudinal direction and freely thermally expansible in the longitudinal direction, no thermal stress attributable to restriction of the casing 20 is generated therein. Similarly, the solid dielectric plate 50 is freely thermally expansible in the longitudinal direction and no thermal stress caused by restriction of the casing 20 occurs. Moreover, since the electrode 30 is merely placed on the solid dielectric plate 50 in a non-fixed state, the electrode 30 and the solid dielectric plate 50 are independently thermally expansible and no thermal stress caused by difference in thermal expansion, is exerted to each other. Accordingly, the electrode 30 is merely linearly elongated and deformed in the longitudinal direction and the solid dielectric plate 50 is not bent. Moreover, since the electrode 30 is pushed against the solid dielectric plate 50 by its dead weight, the lower surface of the electrode 30 and the upper surface of the solid dielectric plate 50 can normally be held in a contacted-state. Owing to this arrangement, it can reliably be prevented to form a gap between the electrode 30 and the solid dielectric plate 50. As a result, arcing can be prevented from occurring between the electrode 30 and the solid dielectric plate 50.

As mentioned above, the solid dielectric plate 50 is not subjected to thermal stress due to difference in thermal expansion between the solid dielectric plate 50 and the electrode 30. In addition, since the solid dielectric plate 50 is allowed to displace in the longitudinal direction by the support mechanisms at the left and right end parts and by the clearances at the front and rear end faces, the solid dielectric plate 50 is not subjected to thermal stress by restriction of the casing 20, etc. By this, the solid dielectric plate 50 can be prevented from being cracked by thermal stress.

In parallel with the flow of the process gas, the pure nitrogen gas coming from the nitrogen gas source is allowed to flow. A part of the nitrogen gas is introduced to the front end part of the passage 30a in the electrode 30 via the nitrogen feed pipe 71, the nitrogen introducing connector 71c and the nitrogen introducing passage 71a in order. Then, the nitrogen gas flows backward through the in-electrode passage 30a from the front end. Then, the nitrogen gas flows frontward through the other in-electrode passage 30b from the rear end via the communicating passage 44a. The nitrogen gas is then delivered to the nitrogen recovering passage 72 from the nitrogen outgoing passage 72a via the nitrogen outgoing connector 72c. Owing to this arrangement, the electrode 30 can be cooled and temperature-adjusted from inside. Moreover, since the nitrogen reciprocally flows along the longitudinal direction of the electrode 30, the entire electrode 30 can be cooled and temperature-adjusted uniformly without bias and a temperature distribution can be prevented from being formed. Since nitrogen is used as a coolant (temperature adjusting medium), there is no worry about the occurrence of electric leakage, etc.

Moreover, another part of the nitrogen gas coming from the nitrogen gas source is introduced to the front end part of a passage 13 located outside the electrode 30 via the nitrogen feed pipe 73, the nitrogen introducing connector 73c and the nitrogen introducing passage 73a. It is then flowed backward through the out-electrode passage 13 from the front end part. It is then flowed frontward through the other out-electrode passage 14 from the rear end part via the communicating passage 44b. It is then delivered to the nitrogen recovering passage 74 from the nitrogen outgoing passage 74a via the nitrogen outgoing connector 74c. Owing to this arrangement, the electrode 30 can also be cooled and temperature-adjusted from outside. Moreover, the electrode 30 can be cooled and temperature-adjusted uniformly without bias as in the case with inside. Owing to this arrangement, the cooling and temperature-adjusting efficiency of the electrode 30 can be enhanced and a temperature distribution can be prevented from being formed not only in the length-wise direction but also in the thickness-wise direction of the electrode 30.

Since the resin-made lining member 40 is disposed in the metal-made casing main body 21 and in addition, since the in-casing space 29 is formed between the lining member 40 and the electrode 30, the electrode 30 and the casing main body 21 can reliably be insulated from each other. In addition, since the space 29 is filled with the pure nitrogen gas, the insulating property can be more enhanced. Owing to this arrangement, abnormal discharge can reliably be prevented from occurring between the electrode 30 and the casing main body 21.

Moreover, even if a gap should be formed between the electrode 30 and the solid dielectric plate 50, nitrogen gas flowing into the gap could prevent arcing from occurring.

Moreover, by exerting pressure to the nitrogen gas, the in-casing space 29 can be made higher in pressure than the gas introducing passage 11 and the processing passage 12, and the process gas can reliably be prevented from permeating into the in-casing space 29. Owing to this arrangement, the insulating property between the electrode 30 and the casing main body 21 can reliably be maintained and the abnormal discharge can more reliably be prevented from occurring. Moreover, as mentioned above, the nitrogen gas flows through the in-casing space 29a and the other in-casing space 29b serving the in-casing space 29a as a forward passage and the other in-casing space 29b as a backward passage, respectively. Thus, even if the process gas should be permeated into the in-casing space 29, it could be immediately exhausted together with the nitrogen gas. Owing to this arrangement, the insulating property between the electrode 30 and the casing main body 21 can more reliably be maintained and the abnormal discharge can more reliably be prevented from occurring.

Since the casing main body 21 is made of metal and formed in a gate-shape in section, it reliably shows rigidity against bending and can be made long.

Since the solid dielectric plate 50 is formed in a flat plate-like shape and simple in shape, it can easily be manufactured and it can easily be met with the requirement for being made in such a long dimension as 2 meters or more.

Since the support member 61 for one end part, which is provided as a slant surface facing downward, of the solid dielectric plate 50 is made of metal and the support member 62 for the other end part is made of resin, it can be made such that no undue force is applied to the downwardly facing slant surface of the solid dielectric plate 50 even if some dimensional differences exist in the solid dielectric plate 50, the support members 61, 62, etc. Owing to this arrangement, the downwardly facing slant surface can be prevented from being broken when the ceramic-made solid dielectric electrode plate 50 is assembled to the apparatus M or in other similar occasions.

Next, other embodiments of the present invention will be described. In the embodiments to follow, same component parts as those in the above-mentioned embodiment are identified, where appropriate, with same reference numerals in the drawings and their description is omitted.

Figure 4:
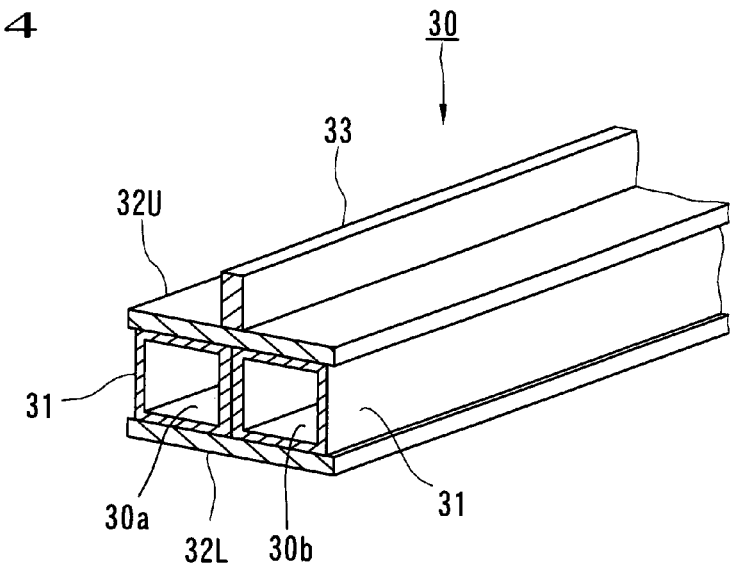
[FIG. 4]

FIG. 4 shows a modification of the electrode.

This electrode 30 is constituted by arranging two metal-made square pipes 31 each having a square shape in section, side by side, in parallel and sandwiching those square pipes 31, 31 with a pair of metal-made flat plates 32U, 32L from above and below, and the electrode 30 extends long in the back and forth direction. A metal-made rib 33 is disposed at the upper surface of the upper-side flat plate 32U along the longitudinal direction. This electrode 30 is merely placed on the solid dielectric plate 50 (not shown), and the lower surface (discharge space forming surface) of the lower-side flat plate 32L is abutted with the upper surface of the solid dielectric plate 50.

The square pipe 31 may be selected from those pipes which are commercially available. The internal spaces of the square pipes 31 are provided as in-electrode passages 30a, 30b for allowing the nitrogen gas to pass therethrough. Accordingly, it is unnecessary to form the so long in-electrode passage as 2 meters by counterboring, etc. as in the electrode of the above-mentioned first embodiment (FIG. 1) and cost-down can be achieved.

Figure 5:
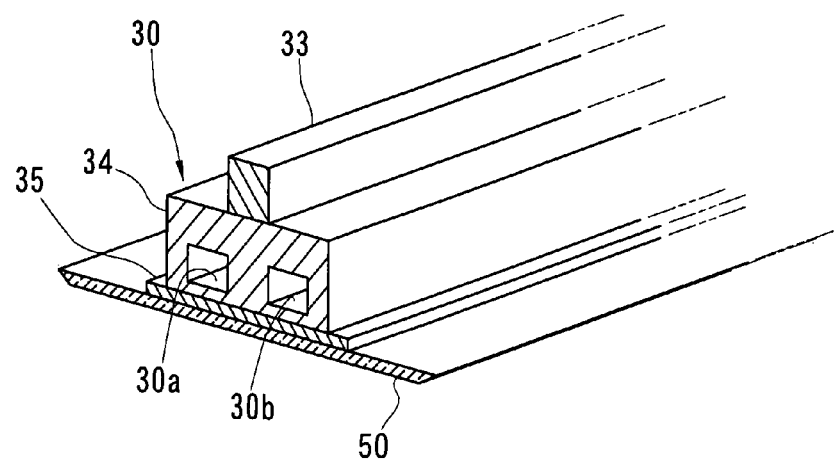
[FIG. 5]

FIG. 5 shows another modification of the electrode.

This electrode 30 is divided into an upper-side first metal member 34 and a lower-side second metal member 35. The first metal member 34 and the second metal member 35 are merely placed one upon the other and they are not fixedly joined by fixing means such as bolting, welding or the like.

The first metal member 34 has the same structure as the electrode 30 of the first embodiment. Briefly to describe, the first metal member 34 is made of metal such as aluminum and stainless steel. The first metal member 34 has the shape of thick flat plate (square shape in section) and extends long in the back and forth direction. The first metal member 34 has a sufficiently larger weight than the second metal member 35. A metal rib 93 is disposed at the upper surface of the first metal member 34. Two passages 30a, 30b are formed in the first metal member 34 as a cooling/temperature-adjusting structure. By allowing a pure nitrogen gas (cooling/temperature-adjusting medium) to flow through the passage 30a as a forward passage and through the passage 30b as a backward passage, the first metal member 34 is cooled/temperature-adjusted from inside.

The cooling/temperature-adjusting structure of the first metal member 34 may be constituted by two pipes 31, 31 as shown in FIG. 4 instead of the passages 30a, 30b.

The second metal member 35 is slightly wider than the first metal member 34 and has the shape of a flat plate sufficiently thinner than the first metal member 34, and it extends long in the back and forth direction. The second metal member 35 is made of aluminum and its thickness is set to be about 2 mm.

This second metal member 35 is merely placed on the solid dielectric plate 50 in a non-fixed state. The first metal member 34 is merely placed on this second metal member 35 in a non-fixed state.

Accordingly, the second metal member 35 is pushed against the solid dielectric plate 50 not only by its dead weight but also by the weight of the first metal member 34. Owing to this arrangement, the entire flat lower surface of the second metal plate 35 can be surface contacted with the solid dielectric plate 50. The first metal member 34 has a thick flat plate-like shape and its load can be uniformly exerted to almost the entire second metal member 35.

At the time of plasma discharge, temperature of the lower surface (abutment surface with the solid dielectric plate 50) of the second metal member 35 becomes highest. Since aluminum as material of the second metal member 35 is good in thermal conduction, heat of the lower surface of the second metal member 35 is rapidly conducted in the widthwise direction. Moreover, the thickness of the second metal member 35 is so small as about 2 mm. Owing to this arrangement, heat can easily reach the upper surface of the second metal member 35. Accordingly, since the entire second metal member 35 is almost uniformly increased in temperature when the plasma discharge is carried out, the temperature gradient in the widthwise direction of the second metal member 35 is very small. The temperature difference between the upper and lower surfaces of the second metal member 35 is so small as within about 1° C. Moreover, the second metal member 35 is merely placed on the solid dielectric plate 50 in a non-fixed state and is independently displaceable in the horizontal direction along the upper surface of the solid dielectric plate 50 by itself alone. Owing to this arrangement, the second metal member 35 is linearly elongated and deformed mainly in the longitudinal direction. Thus, the second metal member 35 can be prevented from being bent and deformed and its flat shape can be maintained. Thus, it can reliably be prevented to form a gap between the second metal member 35 and the solid dielectric plate 50, and arcing can reliably be prevented from occurring therebetween.

Heat is conducted from the second metal member 35 to the first metal member 34 and temperature of the first metal member 34 is also increased. At that time, a temperature gradient is formed in the thickness-wise direction in the first metal member 34 and the first metal member 34 is sometimes bent. However, since the first metal member 34 is not connected directly to the solid dielectric plate 50 and the first metal member 34 is bent and deformed independently from the second metal member 35, thermal stress is not conducted to the second metal member 35. Accordingly, even if the first metal member 34 of the electrode 90 is bent and deformed, no problem arises because a gap is not formed between the solid dielectric plate 50 and the electrode 90, and arcing is not generated therebetween.

Even if the first metal member 34 is bent, the first metal member 34 is necessarily contacted to the second metal member 34 at one spot thereof. Owing to this feature, an electrically conducted-state can be maintained between the first metal member 34 and the second metal member 35, and power can reliably be fed to the second metal member 35 through the first metal member 34.

Since the second metal member 35 is slightly protruded in the widthwise direction from the first metal member 34, arc can be prevented from flying from the end part in the widthwise direction of the first metal member 34.

In parallel with plasma discharge, a pure nitrogen gas (cooling/temperature-adjusting gas) is passed through the passages 30a, 30b. By doing so, the first metal member 34 and thus, the second metal member 35 can be cooled/temperature-adjusted. Thus, those metal members 34, 35 can be restrained from being thermally deformed.

The second metal member 35 may be made of other metal material than aluminum, such as stainless steel. The thickness of the second metal member 35 is set in accordance with heat conductivity of the material such that the temperature difference between the upper surface and the lower surface caused by heating at the time of plasma discharge becomes about 1° C. or less. Accordingly, in case such material as having a smaller heat conductivity than aluminum is used as the second metal member 35, the thickness of the second metal member 35 is reduced. For example, in case of stainless steel, the thickness of the second metal member 35 is set to about 0.3 to 0.5 mm.

In such processing as water-repellent processing which dislikes intrusion of oxygen into the discharge space 12a, it is preferable that the following expression is satisfied.

$$L \times Vf/Vs > 700 \text{ (mm)} \quad \text{(expression 1a)}$$

Figure 6:
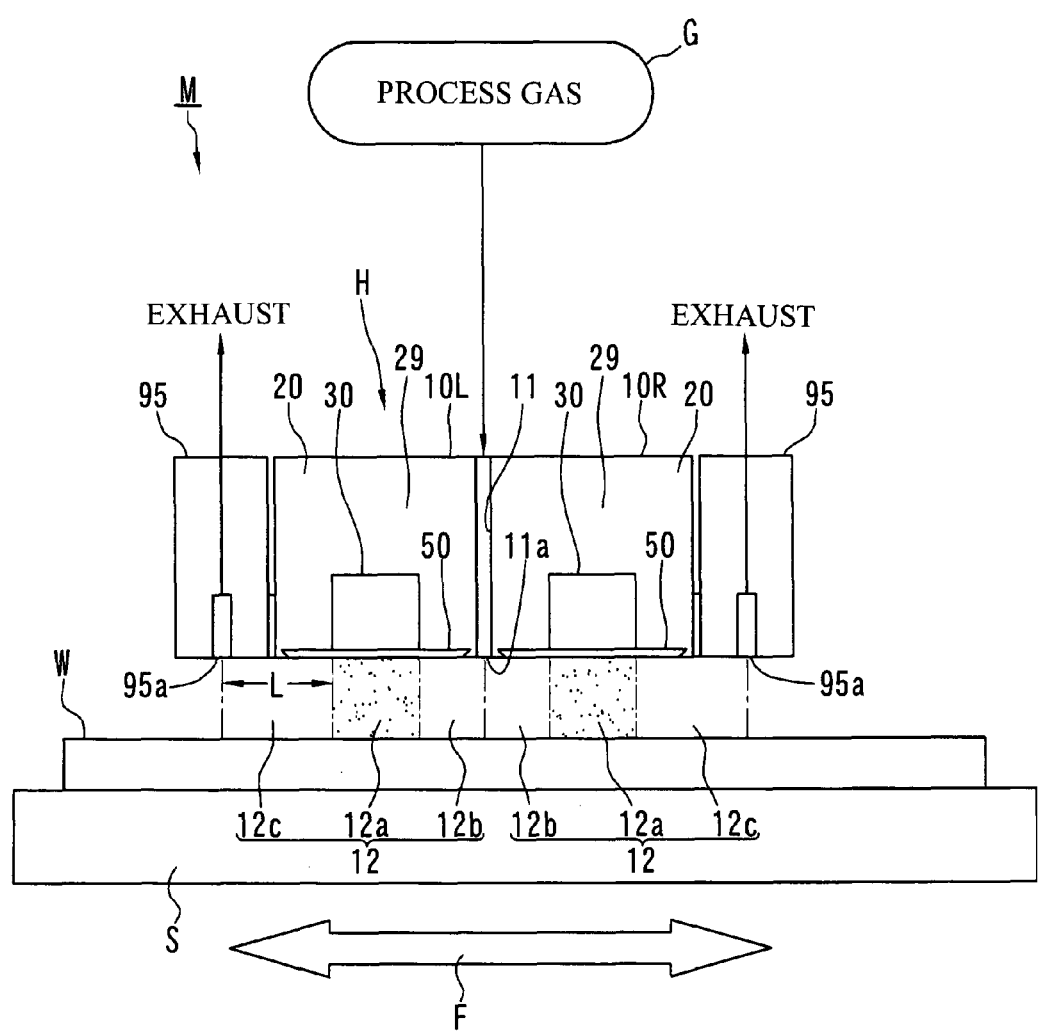
[FIG. 6]

It is more preferable that the following expression is satisfied.

$$L \times Vf/Vs > 1400 \text{ (mm)} \quad \text{(expression 2a)}$$

wherein, as shown in FIGS. 3 and 6, L represents the left and right length (mm) of the downstream side part (12c) of the processing passage 12; Vs, the transfer speed (m/min) of the stage S; and Vf, the flow rate (m/min) of the process gas in the processing passage 12, respectively. The length L of the downstream side part 12c of the processing passage 12 represents the distance from the downstream end of the central discharge space 12a of the processing passage 12 to the gas exhaust port 95a and this distance is equal to the distance from the edge on the gas exhaust port 95a side of the power source electrode 30 to the gas exhaust port 95a.

In FIG. 6, the power source electrode 30 is placed on the solid dielectric plate 50 in a non-fixed state. The in-casing space 29 among the casing 20, the electrode 30 and the solid dielectric plate 50 is filled with pure nitrogen.

The atmosphere around the plasma processing apparatus M is atmospheric air, and the atmospheric pressure is generally equal to atmospheric air pressure.

For example, a carbon fluoride compound, such as $CF_4$, diluted by nitrogen is used as the water-repellent process gas.

The substrate W to be subjected to water-repellent processing is, for example, a liquid crystal glass having a large area.

A resist film is coated on the surface of the liquid crystal glass, and water-repellency is applied to this resist film.

When the substrate W is transferred, for example, in the right direction from the left side, the atmospheric air above the left side part of the substrate W tends to be caught into the downstream side part 12c of the processing passage 12 of the left-side unit 10L due to viscosity. (It should be noted that at that time, the atmospheric air is hardly caught into the processing passage 12 of the right-side unit 10R)

Since it is set such that the length L of the downstream side part 12c of the processing passage 12, the transfer speed Vs and the process gas flow rate Vf in the processing passage 12 satisfy the above-mentioned expressions 1a and 2a, the atmospheric air caught into the downstream side part 12c of the left-side processing passage 12 can be prevented or suppressed from reaching the left-side discharge space 12a. Thus, the concentration of oxygen contained in the atmospheric air invading into the left-side discharge space 12a can be restrained to almost zero (for example, 100 ppm or less).

Similarly, when the substrate W is transferred in the left direction from the right side, the atmospheric air tends to be caught into the downstream side part 12c of the processing passage 12 of the right-side unit 10R. However, since such a setting arrangement as to satisfy the above-mentioned expressions 1a and 2a is made, the atmospheric air can be prevented or suppressed from reaching the discharge space 12a of the right-side unit 10R and thus, the concentration of oxygen contained in the atmospheric air invading into the right-side discharge space 12a can be restrained to almost zero (for example, 100 ppm or less).

Owing to this arrangement, the processing capacity can be maintained sufficiently.

In case the length L of the downstream side part 12c of each processing passage 12c is set to be sufficiently long, the processing capacity can be maintained sufficiently without increasing the consumption amount of the process gas even if the transfer speed Vs is increased. For example, even if the transfer speed Vs is set to such high speed as about Vs=4 m/min, the processing capacity can be maintained sufficiently. As a result, high speed processing can be carried out while maintaining the processing capacity.

One example of water-repellent processing carried out by the same apparatus as that of FIG. 6 will be described. The dimensional arrangement of the apparatus and the processing conditions are as follows.

Dimension of the power source electrode 30: 40 mm (left and right)×700 (back and forth)

Gap (thickness of the processing passage 12) between the processing head H and the substrate W: 1 mm Input power: 1 kW Substrate W: glass (#1737), 880 mm (left and right length)×680 mm (back and forth width)

Pre-processing contact angle of the resist film on the surface of the substrate W: 70° (with water)

Process gas: $N_2+CF_4$

Process gas flow rate of each processing passage 12: Qp=30 slm

Length of the downstream side part 12c of each processing passage 12: L=90 mm

Process gas flow rate in each processing passage 12: Vf=42.8 m/min

Conveying speed: Vs=4 m/min

Accordingly, L×Vf/Vs=963 (mm)>700 (mm) is obtained and thus, the above-mentioned expression 1a is satisfied.

As a result, the contact angle with the water of the resist film on the surface of the substrate after processing could be set to 110°. Thus, a sufficient water-repellent surface could be obtained under such high speed scanning as Vs=4 m/min.

Figure 7:
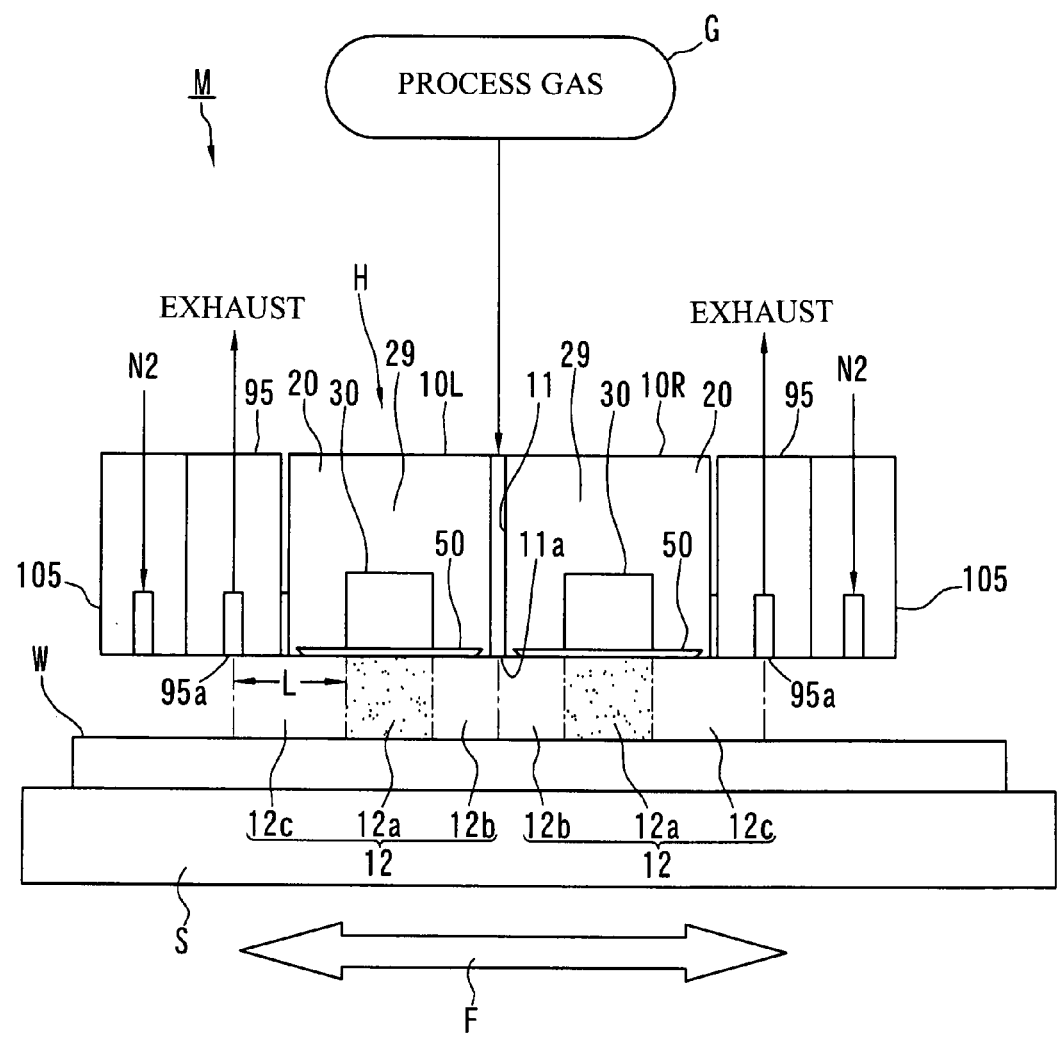
[FIG. 7]
Figure 8:
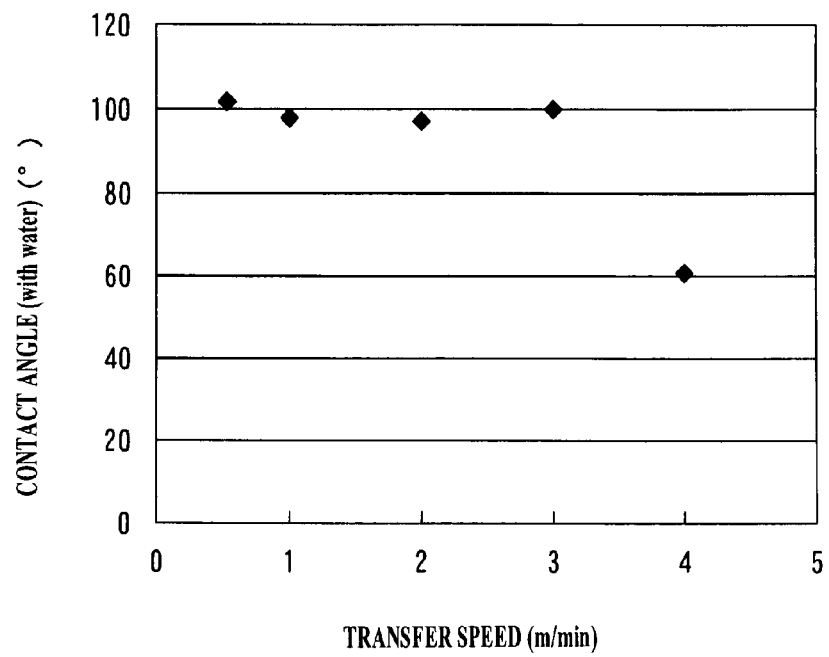
[FIG. 8]
Figure 9:
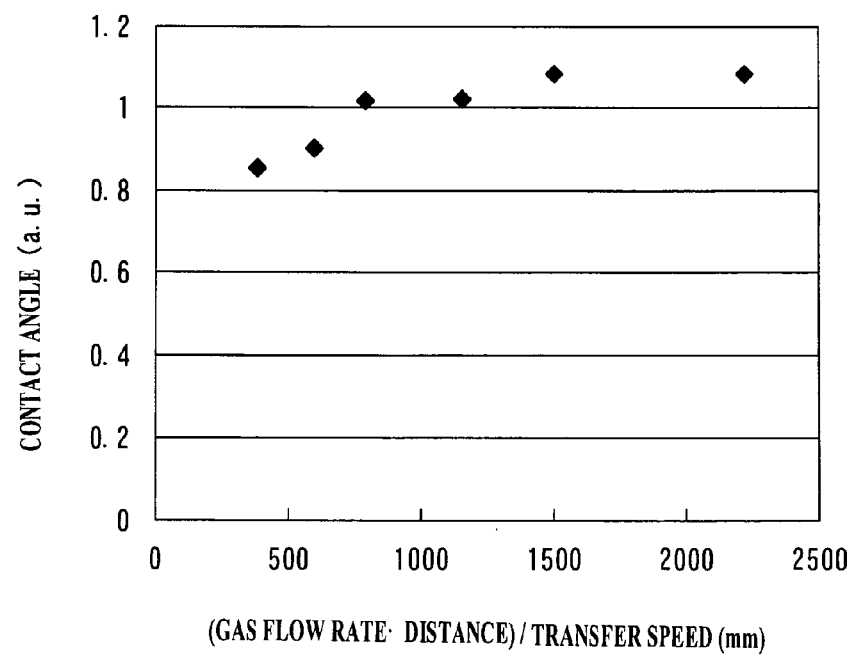
[FIG. 9]

FIG. 7 shows another embodiment of the water-repellent atmospheric pressure plasma processing apparatus M. In this embodiment, curtain gas blowout nozzles 105 are arranged outside the left and right gas exhaust cylinders 95 of the processing head H, respectively. A curtain gas source (not shown) is connected to each blowout nozzle 105. Nitrogen ($N_2$) is used as the curtain gas. The nitrogen source for process gas may be commonly used for curtain gas.

According to the embodiment of FIG. 7, at the time of processing the substrate W, nitrogen gas is blown out of the left and right blowout nozzles 105. By doing so, a nitrogen gas curtain can be formed between the lower end of the blowout nozzle 105 and the substrate W. Owing to this arrangement, the external atmospheric air can more reliably be prevented or suppressed from entering the gas exhaust port 95a side of the blowout nozzle 105 and thus, the processing passage 12. By this, the processing capacity can be maintained more reliably.

In the second embodiment, the setting is made such that the following expressions are established.

$$L \times Vf/Vs > 700 \times r \quad \text{(expression 1)}$$

$$L \times Vf/Vs > 1400 \times r \quad \text{(expression 2)}$$

wherein r is;

$$r = (\text{concentration of oxygen in the peripheral air at the gas exhaust port } 95a)/(\text{concentration of oxygen in the atmospheric air}) \quad \text{(expression 3)}$$

The concentration of oxygen in the atmospheric air is about 20%. If the flow rate of process gas is represented by Qp; the flow rate of curtain gas, Qc; the flow rate of exhaust gas through the gas exhaust port 95a, Qs and the flow rate of atmospheric air caught, Qa, respectively, the following relation can be established among them.

$$Qs = Qp + Qc + Qa \quad \text{(expression 4)}$$

The flow rate Q1 of peripheral air at the gas exhaust port 95a is, as the under-listed expression 5, a sum of the flow rate Qc curtain gas and the flow rate Qa of atmospheric air caught. The flow rate Q1 is equal to a value obtained by subtracting the flow rate Qp of process gas from the entire gas flow rate Qp+Qc+Qa(=Qs).

$$Q1 = Qa + Qc \quad \text{(expression 5)}$$
$$= Qs - Qp$$

From the expressions 3 through 5, r can be expressed by the following expression and can be adjusted by the flow rate Qp of process gas, the flow rate Qc of curtain gas and the flow rate Qs of exhaust gas $$r = (Qs - Qp - Qc)/(Qs - Qp) \quad \text{(expression 6)}$$

By the above-mentioned setting, the oxygen contained in the external atmosphere can be prevented from invading into the processing passage 12 reliably and the processing capacity can be maintained more reliably; without increasing the consumption of process gas. Moreover, the length L of the downstream side part 12c of the processing passage 12 can be made shorter than that in the first embodiment and a more high-speed scanning can be realized.

One example of water-repellent processing carried out by the same apparatus of FIG. 7 will be described. The dimensional constitution of the apparatus and the processing conditions are as follows.

Dimension of power source electrode 30: 40 mm (left and right)×700 (back and forth)

Gap (thickness of processing passage 12) between processing head H and substrate W: 1 mm Input power: 1 kW Substrate W: glass (#1737), 880 mm (left and right length)×680 mm (back and forth width)

Pre-processing contact angle of the resist film on the surface of substrate W: 70° (with water)

Process gas: $N_2+CF_4$

Process gas flow rate of each processing passage: Qp=15 slm

Curtain gas flow rate through each nozzle 105: Qc=17.5 slm

Exhaust gas flow rate through each gas exhaust port 95a: Qs=50 l/min

Ratio of concentration of caught oxygen with respect to the concentration of oxygen in the atmospheric air: r=0.5

Length of downstream side part 12c of each processing passage 12: L=90 mm

Process gas flow rate in each processing passage 12: Vf=21.4 m/mm

Conveying speed: Vs=4 m/min

Thus, L×Vf/Vs=482 (mm)>700 (mm)×r=350 (mm) can be obtained, which satisfies the expression 1.

As a result, the contact angle CA of the resist film on the surface of the substrate W after processing could be made as CA>100° and a sufficient water-repellent surface could be obtained under such high-speed scanning as Vs=4 m/min. It was confirmed that by forming a gas curtain, the length L of the downstream side part 12c of the processing passage 12 and the consumption amount of process gas can be made sufficiently smaller than that of the case of FIG. 6 where no gas curtain is employed.

Figure 10:
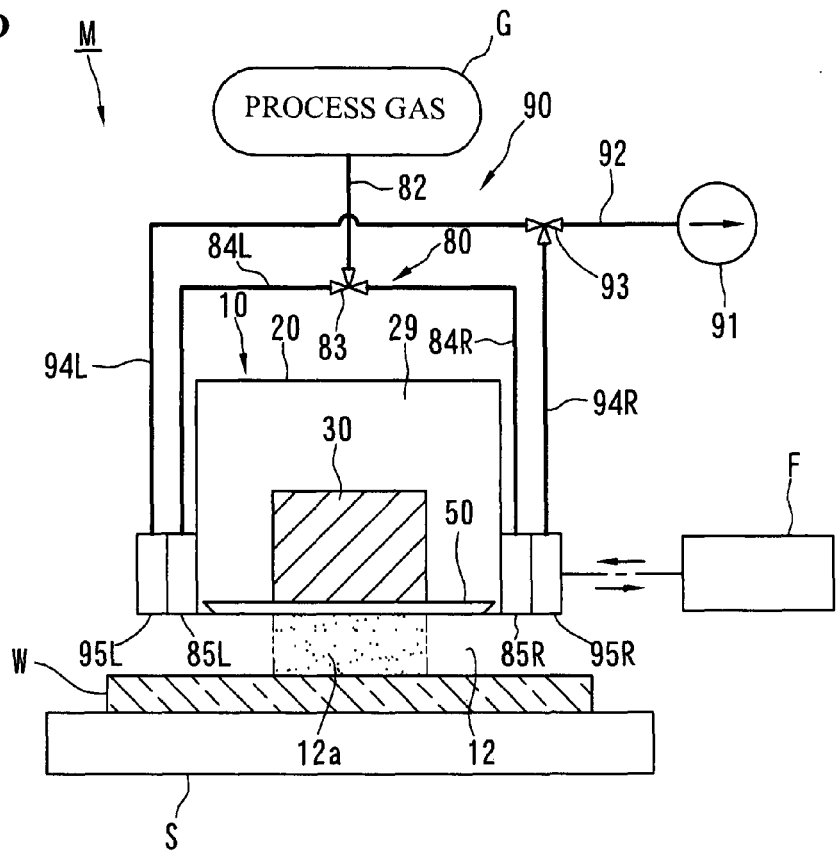
[FIG. 10]

FIG. 10 shows another embodiment of a water-repellent atmospheric pressure plasma processing apparatus. Gas around the apparatus M is the atmospheric air.

Although a processing head of this embodiment is composed of a single processing unit 10, it may be composed of a plurality of processing units arranged in parallel.

In this embodiment, the processing unit 10 is connected to the moving mechanism F. By this moving mechanism F, the processing unit 10 is reciprocally moved in the left and right direction (in the opposing direction of a pair of introducing nozzles 85L, 85R as later described). For example, if the left direction is a forward direction, the right direction is a backward direction.

Of course, as in the previously-mentioned embodiment, it is accepted that the processing unit 10 is fixed and the stage S is connected to the moving mechanism so that the stage S is reciprocally moved leftward and rightward.

The bottom surface of the processing unit 10 constitutes a surface opposing the substrate or a surface defining the processing passage.

The atmospheric pressure plasma processing apparatus M is provided with a process gas feed system 80 and a gas exhaust system 90.

The process gas feed system 80 is constructed as follows.

A common feed passage 82 extends from a process gas source G. The process gas source G makes a water-repellent process gas by mixing approximate amounts of a carbon fluoride compound such as $CF_4$ and nitrogen and delivers the same into a common feed passage 82. Two individual feed passages 84L, 84R are branched from the common feed passage 82 through an electromagnetic three-way valve 83 (introducing nozzle switch means). The electromagnetic three-way valve 83 selectively connects one of the two individual feed passages 84L, 84R to the common feed passage 82 and shuts off the other individual feed passage. It is also accepted that instead of the electromagnetic three-way valve 83, the respective individual feed passages 84L, 84R are provided with an electromagnetic opening-and-closing valve, and one of those electromagnetic opening-and-closing valves is selectively opened and the other is closed.

The processing unit 10 is provided at a left-side part thereof with a gas introducing nozzle 85L and at a right-side part thereof with a gas introducing nozzle 85R. The left-side gas introducing nozzle 85L is connected with the individual feed passage 84L. The right-side gas introducing nozzle 85R is connected with the individual feed passage 84R.

By the electromagnetic three-way valve 83, one of the individual feed passages 84L, 84R and thus, one of the left and right introducing nozzles 85L, 85R is selectively opened and communicated with the process gas source G.

Each of the individual feed passages 84L, 84R and each of the nozzles 85L, 85R may be provided with opening/closing means as the introducing nozzle switch means instead of the electromagnetic three-way valve 83.

The gas exhaust system 90 is constructed in the following manner.

The processing unit 10 is provided at the further outside of the left and right gas introducing nozzles 85L, 85R with gas exhaust nozzles 95L, 95R, respectively. Individual gas exhaust passages 94L, 94R extend from the gas exhaust nozzles 95L, 95R, respectively. The two individual gas exhaust passages 94L, 94R are connected to an electromagnetic three-way valve 93 (gas exhaust nozzle switch means) from which a common gas exhaust passage 92 extends and is connected to gas exhaust means 91 such as a suction pump.

By the electromagnetic three-way valve 93, one of the individual gas exhaust valves 94L, 94R and thus, one of the left and right gas exhaust nozzles 95L, 95R is selectively opened and communicated with the gas exhaust means 91.

Each of the individual feed passages 94L, 94R and each of the nozzles 95L, 95R may be provided with opening/closing means as the gas exhaust nozzle switch means instead of the electromagnetic three-way valve 93.

By feed of voltage from the power source to the power source electrode 30, the intermediate part of the processing passage 12 is turned out to be a plasma discharge space 12a having a generally atmospheric pressure. In parallel with the feed of voltage, process gas is blown out from the process gas feed system 80 to the processing passage 12. This process gas is introduced to the discharge space 12a, where it is plasmatized and contacted with the substrate W, and as a result, reaction occurs. By this, the surface of the substrate W can be water-repellent processed. The processed gas and the reaction by-products are exhausted through the gas exhaust system 90. Simultaneously, the processing unit 10 is reciprocally moved leftward and rightward and the entire surface of the substrate W is water-repellent processed.

At the time of plasma processing, the electromagnetic three-way valves 83, 83 and the moving mechanism F are cooperatively operated. By this, the process gas is normally introduced into the processing passage 12 from the front in the advancing direction of the processing unit 10 into the processing passage 12.

Figure 11:
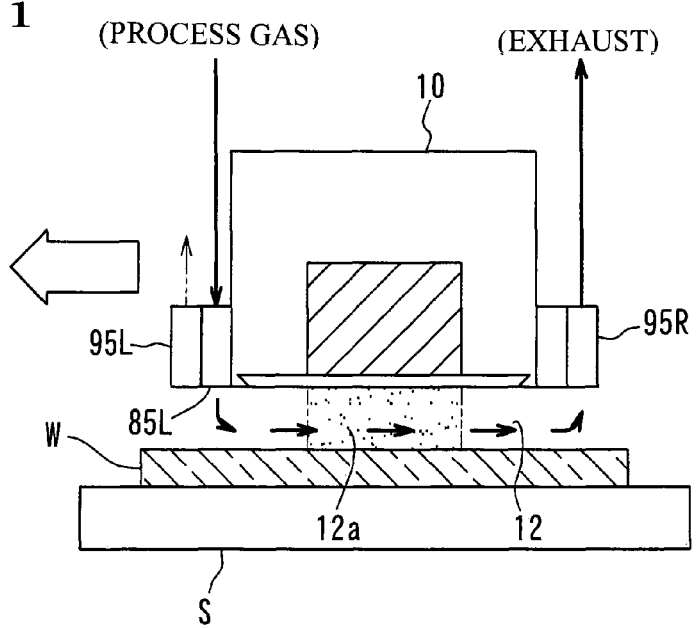
[FIG. 11]

As shown in FIG. 11, when the processing unit 10 is moved in the left direction by the moving mechanism F, the left-side gas introducing nozzle 85L is opened by the electromagnetic three-way valve 83 of the process gas feed system 80, and the right-side gas introducing nozzle 85R is closed. Moreover, by the electromagnetic three-way valve 93 of the gas exhaust system 90, the right-side gas exhaust nozzle 95R is opened and the left-side gas exhaust nozzle 95L is closed.

By this, the process gas is blown out from the left-side introducing nozzle 85L, flowed within the processing passage 12 rightwards and sucked and exhausted through the right-side gas exhaust nozzle 95R. At that time, since the right end part of the processing passage 12 is moved in the retreating direction with respect to the external atmosphere, the external atmospheric air is hardly caught into the processing passage 12 from the right end part of the processing passage 12. Moreover, invasion of the external atmospheric air hardly occurs at the left end part of the processing passage 12 due to curtain effect of the process gas.

When the processing unit 10 reaches the left-side limit position in the range of reciprocal movement, the moving mechanism F reverses the moving direction of the processing unit 10 in the right direction. In operative connection thereto, the left-side gas introducing nozzle 85L of the process gas feed system 80 is closed, the right-side gas introducing nozzle 85R is opened, the right-side gas exhaust nozzle 95R of the gas exhaust system 90 is closed, and the left-side gas exhaust nozzle 95L is opened.

Figure 12:
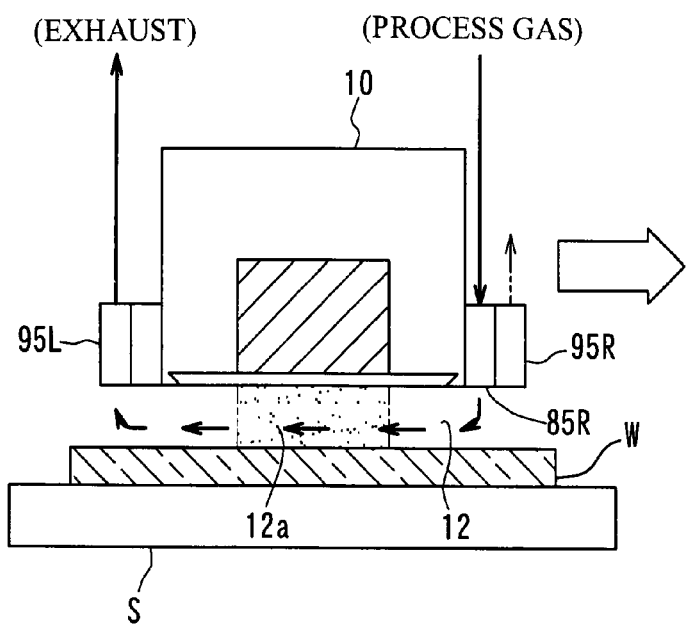
[FIG. 12]

By this, as shown in FIG. 12, when the processing unit 10 is moved in the right direction, the process gas is blown out through the right-side introducing nozzle 85R, flowed within the processing passage 12 leftwards, and sucked and exhausted through the left-side gas exhaust nozzle 95L. At that time, since the left end part of the processing passage 12 is moved in the retreating direction with respect to the external atmosphere, the external atmospheric air is hardly caught into the processing passage 12 from the left end part of the processing passage 12. Moreover, invasion of the external atmospheric air hardly occurs at the right end part of the processing unit 12 due to curtain effect of the process gas.

When the processing unit 10 reaches the right-side limit position in the range of reciprocal movement, the moving mechanism F reverses the moving direction of the processing unit 10 in the left direction. In operative connection thereto, the left-side gas introducing nozzle 85L of the process gas feed system 80 is opened again, the right-side gas introducing nozzle 85R is closed, the right-side gas exhaust nozzle 95R of the gas exhaust system 90 is opened, and the left-side gas exhaust nozzle 95L is closed.

By repeating the above-mentioned operation, the external atmospheric air can normally be prevented from invading into the processing passage 12 irrespective whether the processing unit 10 is moved in the left direction or in the right direction. As a result, the moving speed and thus, the plasma processing can be made high-speed while sufficiently maintaining the processing capacity of the atmospheric pressure plasma processing.

It is also accepted that as shown in FIG. 11, at the time when process gas is blown out through the left-side introducing nozzle 85L and sucked through the right-side gas exhaust nozzle 95R, a small amount of gas is also sucked through the left-side nozzle 95L (see the imaginary line of FIG. 11). Owing to this arrangement, in case a part of the process gas blown out through the left-side introducing nozzle 85R tends to leak outside, such leaking gas can be exhausted through the gas exhaust nozzle 95L. Similarly, it is also accepted that as shown in FIG. 12, at the time when process gas is blown out through the right-side introducing nozzle 85R and sucked through the left-side gas exhaust nozzle 95L, a small amount of gas is also exhausted through the right-side gas exhaust nozzle 95R (see the imaginary line of FIG. 12). Owing to this arrangement, in case a part of the process gas blown out through the right-side introducing nozzle 85R tends to leak right outside, such leaking gas can be exhausted through the right-side nozzle 95R. As a result, process gas can be prevented from leaking outside reliably.

It is preferable that the individual gas exhaust passages 94L, 94R are each provided with the gas exhaust nozzle adjusting means such as an electromagnetic flow rate adjusting means instead of the gas exhaust nozzle switch means such as the electromagnetic flow rate adjusting valve, so that the sucking amount through the respective gas exhaust nozzles 95L, 95R can be adjusted.

Figure 13:
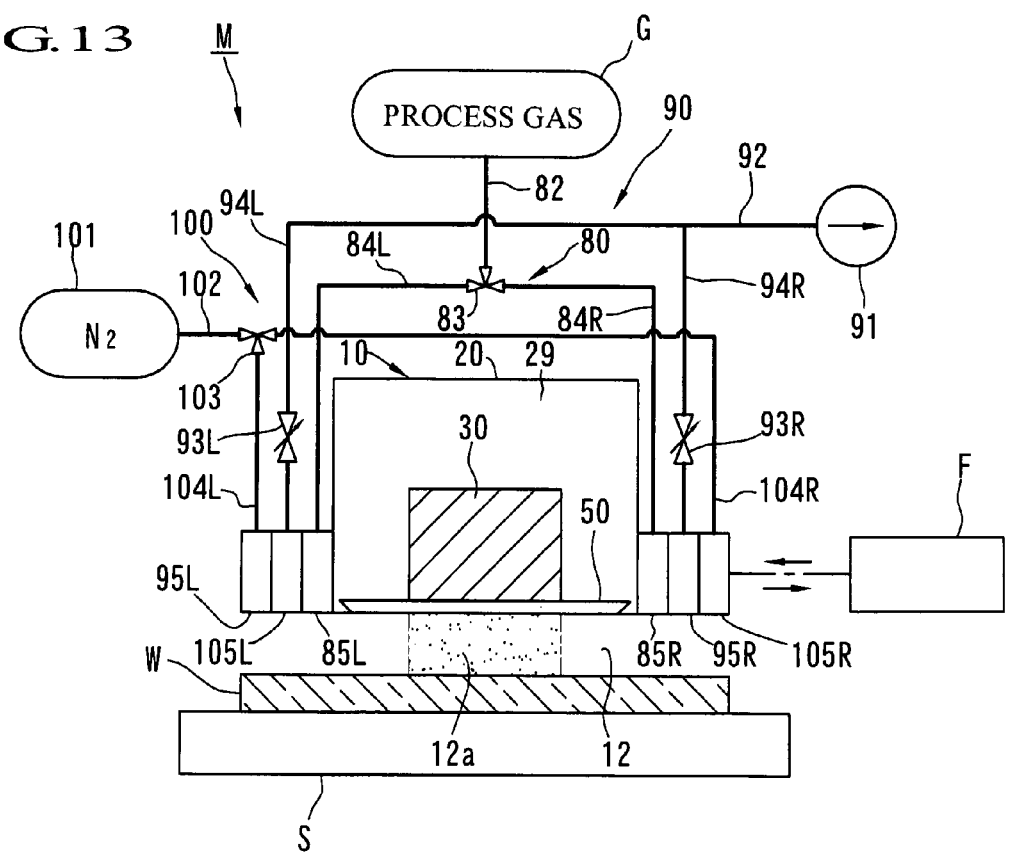
[FIG. 13]

FIG. 13 shows another embodiment of the water-repellent atmospheric pressure plasma processing apparatus M. The apparatus M of this embodiment additionally employs a curtain gas feed system 100. The curtain gas feed system 100 is constructed in the following manner.

A common feed passage 102 extends from a curtain gas source 101. Nitrogen is used as the curtain gas. Two individual feed passages 104L, 104R are branched from the common feed passage 102 through an electromagnetic three-way valve 103 (curtain nozzle switch means).

The processing unit 10 is provided at the further outside of the left and right gas exhaust nozzles 95L, 95R with curtain nozzles 105L, 105R, respectively. The individual feed passage 104L is connected to the left-side curtain nozzle 105L, and the individual feed passage 104R is connected to the right-side curtain nozzle 105R.

The curtain nozzle 105L may be disposed between the gas exhaust nozzle 951L and the introducing nozzle 85L. The curtain nozzle 105R may be disposed between the gas exhaust nozzle 95R and the introducing nozzle 85R.

By the electromagnetic three-way valve 103, one of the individual feed passages 104L, 104R and thus, one of the left and right curtain nozzles 105L, 105R is selectively opened and communicated with the curtain gas source 101.

It is also accepted that the individual feed passages 104L, 104R are, respectively, provided with electromagnetic opening/closing valves as the curtain nozzle switch means instead of the electromagnetic three-way valve 103, and one of those electromagnetic opening/closing valves is selectively opened and the other is closed. In the alternative, it is also accepted that the individual feed passages 104L, 104R are, respectively, provided with electromagnetic flow rate control valves, one of the electromagnetic flow rate control valves is selected to relatively increase its opening degree and the other is relatively decreased in opening degree or completely closed.

In the gas exhaust system 90 of the embodiment of FIG. 13, instead of the electromagnetic three-way valve 93, the individual feed passage 94L is provided with an electromagnetic flow rate control valve 93L (gas exhaust nozzle adjusting means), and the individual feed passage 94R is provided with an electromagnetic flow rate control valve 93R (gas exhaust nozzle adjusting means).

According to this embodiment, at the time of plasma processing the substrate W, the electromagnetic valves 83, 93L, 93R, 103 and the moving mechanism F are cooperatively operated. This will be described in detail hereinafter.

As shown in FIG. 14, when the processing unit 10 is moved in the left direction by the moving mechanism F, the left-side gas introducing nozzle 85L is opened and the right-side gas introducing nozzle 85R is closed by the electromagnetic three-way valve 83 of the process gas feed system 80. Moreover, the right-side gas exhaust nozzle 95R is opened to the extent corresponding to the fed flow rate or more of process gas by the control valve 93R of the gas exhaust system 90, and the left-side gas exhaust nozzle 95L is opened to the extent generally corresponding to the blown flow rate of curtain gas.

Moreover, the left-side curtain nozzle 105L is opened and the right-side curtain nozzle 105R is closed by the electromagnetic three-way valve 103 of the curtain gas feed system 100.

Owing to this arrangement, process gas is blown through the left-side introducing nozzle 85L, flows through the inside of the processing path 12 in the right direction and sucked and exhausted through the right-side gas exhaust nozzle 95R. In addition, nitrogen gas is blown out through the left-side curtain nozzle 105L and a nitrogen gas curtain is formed outside the left end part of the processing passage 12. By this nitrogen gas curtain, the external atmospheric air and the left end part of the processing passage 12 can be isolated from one another and the external atmospheric air prevented from invading into the processing passage 12 through the left end part of the processing passage 12 reliably. The curtain gas can be sucked and exhausted through the gas exhaust nozzle 95L.

As shown in FIG. 15, when the processing unit 10 is moved in the right direction by the moving mechanism F, the right-side gas introducing nozzle 85R of the process gas feed system 80 is opened and the left-side gas introducing nozzle 85L is closed. Moreover, the left-side gas exhaust nozzle 95L of the gas exhaust system 90 is opened to the extent corresponding to more than the fed flow rate of process gas, and the right-side gas exhaust nozzle 95R is opened to the extent generally corresponding to the blown flow rate of curtain gas. Moreover, the right-side curtain nozzle 105R of the curtain gas feed system 100 is opened and the left-side curtain nozzle 105L is closed.

Owing to this arrangement, process gas is blown through the right-side introducing nozzle 85R, flows through the inside of the processing path 12 in the left direction and sucked and exhausted through the left-side gas exhaust nozzle 95L. In addition, nitrogen gas is blown out through the right-side curtain nozzle 105R and a nitrogen gas curtain is formed outside the right end part of the processing passage 12. By this nitrogen gas curtain, the external atmospheric air and the right end part of the processing passage 12 can be isolated from each other and the external atmospheric air can be prevented from invading into the processing passage 12 through the right end part of the processing passage 12 reliably. The curtain gas can be sucked and exhausted through the gas exhaust nozzle 95R.

As a result, the processing capacity of atmospheric pressure plasma processing can be obtained more reliably.

If the processing capacity is more enhanced when a small amount of oxygen is included in the process gas than when oxygen is not at all included in the process gas, as in the case of the cleaning processing, the cooperative operation with the moving direction of the processing unit 10 by the moving mechanism F and the moving of the respective electromagnetic valves may be reversed to those in the above-mentioned water-repellent embodiment so that process gas is normally introduced into the processing passage 12 from backward of the advancing direction of the processing unit 110.

The present invention is not limited to the above-mentioned embodiments but many changes and modifications can be made.

It is also accepted that a corrosion resisting coating made of Teflon (registered trademark) or the like is applied to the outer surface on the downstream side of the processing passage 12 in the casing main body 21.

The plate supporting member 62 on the downstream side along the gas flow of the processing passage 12 may include other materials inasmuch as the main component is such corrosion resisting material as PVDF ((poly-vinylidene fluoride) and PET (polyethylene terephthalate). A plurality of corrosion resisting components may be mixed therein such as PVDF (poly-vinylidene fluoride) and PET (polyethylene terephthalate).

From the viewpoint of preventing breakage of a ceramic-made solid dielectric 50, it is accepted that the plate support member 62 on the downstream side is made of metal and the plate support member 61 on the upstream side is made of resin or the like which is softer than the solid dielectric 50, and it is also accepted that both the members 61, 61 are made of resin or the like which is softer than the solid dielectric 50.

The metal-made plate support member 61 may be integral with the casing main body 21.

Other substances (for example, water, air and the like) than nitrogen may be used as a cooling/temperature adjusting medium for the electrode.

The processing head H may be composed of only one processing unit so that the total amount of process gas flows from one end of the only one processing unit to the other end.

The technique for filling nitrogen into in-casing space and the technique for applying a corrosion resisting property to the downstream side of the discharge space are not only applicable to the so-called direct-type plasma processing where the substrate is arranged in the discharged space but also to the remote-type plasma processing where the substrate is arranged outside the discharge space and a plasma gas is blown toward the substrate.

An electrode structure and a processing unit structure according to the present invention can be applied to various plasma processing such as etching, film formation and surface modification, and they can be applied not only to an atmospheric pressure processing technique but also to a reduced pressure processing technique.

INDUSTRIAL APPLICABILITY

The present invention can be utilized for plasma surface processing of a substrate, for example, in semiconductor manufacture.

The stage S is disposed under the processing head H. The stage S is electrically grounded and constitutes an earth electrode (second electrode) for an application electrode 30 as later described. The stage S is connected with a moving mechanism F (FIG. 3). By this moving mechanism F, the stage S is moved in the left and right direction. It is also accepted that the stage S is fixed and the processing head H is movable.

As shown in FIGS. 1 and 2, the processing unit 10 comprises a casing 20 as a main body and first electrode 30 received in the casing 20. The processing unit 10 extends long in a back and forth direction (orthogonal direction to the paper surface of FIG. 1, and left and right direction of FIG. 2).

As shown in FIGS. 1 and 2, the electrode 30 is made of metal such as aluminum or stainless steel and extends long in the back and forth horizontal directions in a square shape in section. The length of this electrode 30, is, for example about 2 meters. A rib 33 is disposed at an upper part of the electrode 30. Means for fixing the rib 33 to the electrode 30 is a bolt (not shown) or the like. The rib 33 extends in the same direction as the electrode 30, reinforces the electrode 30 and prevents the bending of the electrode 30. The rib 33 is made of metal (stainless steel or the like) same as the electrode 30 and electrically integral with the electrode 30. though not show, a power feed wire projects form the rib 33, and a power feed wire extends from the power feed pin and connected to a power source. Owing to this arrangement, power is fed to the electrode 30. By the power thus fed, an atmospheric pressure glow discharge generates between the electrode 30 and the substrate W, etc. located under the electrode 30 and serving as a ground electrode (i.e., at the central part 12a of the processing passage 12), so that the central part 12a of the processing passage 12 functions as a discharge space. The lower surface of the electrode 30 functions as a "discharge space forming surface (glow-discharging surface)".

The invention claimed is:

1. An apparatus for carrying out plasma processing by introducing a process gas into a discharge space, said plasma processing apparatus comprising
a first electrode having a glow-discharging surface, an opposite surface opposite from the glow-discharging surface and a side surface crossing both the glow-discharging surface and the opposite surface, a solid dielectric disposed at said glow-discharging surface;
a second electrode facing to the glow-discharging surface of the first electrode, a glow discharge being generated between the glow-discharging surface of the first electrode and the second electrode, the discharge space formed between the solid dielectric and the second electrode; and
a casing for receiving said first electrode in such a manner as to surround said first electrode such that said solid dielectric disposed at said glow-discharging surface is exposed,
an in-casing space being formed between said casing and the opposite surface and the side surface of said first electrode received in said casing,
said in-casing space being filled with substantially pure nitrogen gas,
wherein the first and second electrodes are metallic, and
wherein the first metallic electrode is free at least in a horizontal direction and placed on an upper surface of said dielectric plate.

2. A plasma processing apparatus according to claim 1, wherein a nitrogen gas introducing passage and a nitrogen gas outgoing passage are connected to said in-casing space respectively.

3. A plasma processing apparatus according to claim 1, wherein nitrogen gas pressure in said in-casing space is higher than gas pressure in said discharge space.

4. A plasma processing apparatus according to claim 1, wherein an in-electrode passage for adjusting the temperature of said first electrode is formed in said first electrode, and nitrogen gas is passed through said in-electrode passage.

5. A plasma processing apparatus according to claim 4, wherein said first electrode includes a metal-made plate having said glow-discharging surface and a square pipe disposed at a surface on the opposite side of said glow-discharging surface of said metal-made plate, and an interior of said square pipe serves as said in-electrode passage.

6. A plasma processing apparatus according to claim 1, wherein a bottom part of said casing is open,
said solid dielectric is composed of a plate having a strength sufficient enough to support the dead weight of said first electrode by itself alone and horizontally supported in such a manner as to close said bottom part of said casing, and
said first electrode is placed on the upper surface of said solid dielectric plate in a non-fixed state such that the dead weight of said first electrode is almost totally applied to said solid dielectric plate.

7. A plasma processing apparatus according to claim 1, wherein said casing is provided with an upstream member for defining a space connected to the upstream side of said discharge space and a downstream member for defining a space connected to the downstream side of said discharge space, and
said upstream member is composed of metal and insulated from said first electrode, and said downstream member is composed of corrosion-resisting resin.

8. A plasma processing apparatus according to claim 1, wherein said apparatus further comprises a moving mechanism for moving a substrate to be processed relative to said casing along the gas flow direction in said discharge space,
said casing is provided at a side part thereof with a gas exhaust port for intaking gas from said discharge space, and
the following relation is satisfied:

$$L \times Vf/Vs > 700 \times r \quad (1)$$

wherein:
L: distance (mm) from the downstream end of said discharge space to said gas exhaust port
Vf: flow rate of the process gas in said discharge space
Vs: transfer speed by the moving mechanism
r: ratio of concentration of oxygen in the peripheral air excluding the process gas at said gas exhaust port with respect to the concentration of oxygen in the atmospheric air.

9. A plasma processing apparatus according to claim 1, wherein said casing is provided at both ends thereof with a pair of introducing nozzles for introducing process gas into said discharge space,
said apparatus further comprises a moving mechanism that reciprocally moves said casing in the opposing directions of said pair of introducing nozzles relative to a substrate to be processed, and
introducing nozzle switch means that selectively connects one of said pair of introducing nozzles to a process gas source in accordance with the moving direction by said moving mechanism.

10. The plasma processing apparatus according to claim 6, wherein the solid dielectric plate formed as a slant surface facing downward.

11. The plasma processing apparatus according to claim 10, wherein the slant surface facing downward of the solid dielectric plate are abutted with slant end faces facing upward of a pair of plate supporters disposed at lower ends of a plate support member connected to side walls of the casing.

12. The plasma processing apparatus according to claim 1, wherein a rib is disposed at an upper part of the first electrode.

13. The plasma processing apparatus according to claim 1, the first electrode extends in a back and forth direction in the horizontal direction.

* * * * *